US009230554B2

(12) United States Patent
Moriya et al.

(10) Patent No.: US 9,230,554 B2
(45) Date of Patent: Jan. 5, 2016

(54) ENCODING METHOD FOR ACQUIRING CODES CORRESPONDING TO PREDICTION RESIDUALS, DECODING METHOD FOR DECODING CODES CORRESPONDING TO NOISE OR PULSE SEQUENCE, ENCODER, DECODER, PROGRAM, AND RECORDING MEDIUM

(75) Inventors: Takehiro Moriya, Kanagawa (JP); Noboru Harada, Kanagawa (JP); Yutaka Kamamoto, Kanagawa (JP); Yusuke Hiwasaki, Tokyo (JP); Masahiro Fukui, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 241 days.

(21) Appl. No.: 13/984,773

(22) PCT Filed: Feb. 8, 2012

(86) PCT No.: PCT/JP2012/052884
§ 371 (c)(1),
(2), (4) Date: Aug. 9, 2013

(87) PCT Pub. No.: WO2012/111512
PCT Pub. Date: Aug. 23, 2012

(65) Prior Publication Data
US 2013/0317814 A1 Nov. 28, 2013

(30) Foreign Application Priority Data
Feb. 16, 2011 (JP) .................................. 2011-030393

(51) Int. Cl.
*G10L 19/18* (2013.01)
*H03M 5/06* (2006.01)
*G10L 19/12* (2013.01)

(52) U.S. Cl.
CPC ............. *G10L 19/12* (2013.01); *G10L 19/18* (2013.01); *H03M 5/06* (2013.01)

(58) Field of Classification Search
CPC .................................. G10L 19/18; H03M 5/06
USPC ........................................................... 704/219
See application file for complete search history.

(56) References Cited

U.S. PATENT DOCUMENTS

| 5,915,234 A | 6/1999 | Itoh |
| 7,013,269 B1 | 3/2006 | Bhaskar et al. |

(Continued)

FOREIGN PATENT DOCUMENTS

| EP | 0 762 386 A2 | 3/1997 |
| JP | 61-184912 A | 8/1986 |

(Continued)

OTHER PUBLICATIONS

Office Action issued Jan. 8, 2015 in Korean Patent Application No. 10-2013-7021159 (with English language translation).

(Continued)

*Primary Examiner* — Susan McFadden
(74) *Attorney, Agent, or Firm* — Oblon, McClelland, Maier & Neustadt, L.L.P.

(57) ABSTRACT

In encoding, the number of bits to be assigned to codes corresponding to noise or a pulse sequence obtained according to prediction analysis applied to time series signals included in a predetermined time interval is switched according to whether an index that indicates a level of periodicity and/or stationarity of input time series signals satisfies a condition that indicates high periodicity and/or high stationarity or a condition that indicates low periodicity and/or low stationarity, to acquire the codes corresponding to the noise and the pulse sequence. In decoding, a decoding mode for codes corresponding to noise or a pulse sequence included in codes corresponding to a predetermined time interval is switched according to the same criterion as that described above to decode the codes corresponding to the noise or the pulse sequence to acquire noise or a pulse sequence corresponding to the predetermined time interval.

24 Claims, 8 Drawing Sheets

(56) References Cited

U.S. PATENT DOCUMENTS

| | | | |
|---|---|---|---|
| 7,272,556 B1 * | 9/2007 | Aguilar et al. | 704/230 |
| 7,280,959 B2 | 10/2007 | Bessette | |
| 8,078,457 B2 * | 12/2011 | Ghenania et al. | 704/219 |
| 9,047,865 B2 * | 6/2015 | Aguilar et al. | |
| 2002/0111800 A1 | 8/2002 | Suzuki et al. | |
| 2004/0049380 A1 | 3/2004 | Ehara et al. | |
| 2005/0108009 A1 | 5/2005 | Lee et al. | |
| 2009/0043572 A1 | 2/2009 | Teo et al. | |
| 2012/0265525 A1 * | 10/2012 | Moriya et al. | 704/211 |

FOREIGN PATENT DOCUMENTS

| | | |
|---|---|---|
| JP | 7-225599 A | 8/1995 |
| KR | 10-2004-0029312 A | 4/2004 |
| KR | 10-2005-0046204 A | 5/2005 |
| WO | WO 2006/085586 A1 | 8/2006 |

OTHER PUBLICATIONS

Japanese Office Action issued Jul. 8, 2014 in Patent Application No. 2012-557910 with English Translation.

Office Action issued on Feb. 13, 2015 for corresponding Russian Patent Application No. 2013137251 (with English Translation).

3rd Generation Partnership Project (3GPP), Technical Specification (TS)26.090, "AMR speech codec, Transcoding functions" Version 4.0.0 total pp. 56, (Mar. 2001).

"ITU-T Recommendation G.729, Coding of Speech at 8 kbit/s using Conjugate-Structure Algebraic-Code-Excited Linear-Prediction (CS-ACELP)." Total pp. 38, (Mar. 2001).

International Search Report issued Mar. 13, 2012 in PCT/JP12/052884 Filed Feb. 8, 2012.

Extended Search Report issued Aug. 11, 2014 in European Patent Application No. 12747075.5.

Office Action issued on May 12, 2015 in European Patent Application No. 12 747 075.5.

Erdal Paksoy, et al, "A variable-rate multimodal speech coder with gain-matched analysis-by-synthesis", IEEE International Conference on Acoustics, XP10225903A, vol. 2, Apr. 21, 1997, pp. 751-754.

Office Action mailed Nov. 4, 2015, in Chinese Patent Application No. 201280008459.5 (with English-language translation).

* cited by examiner

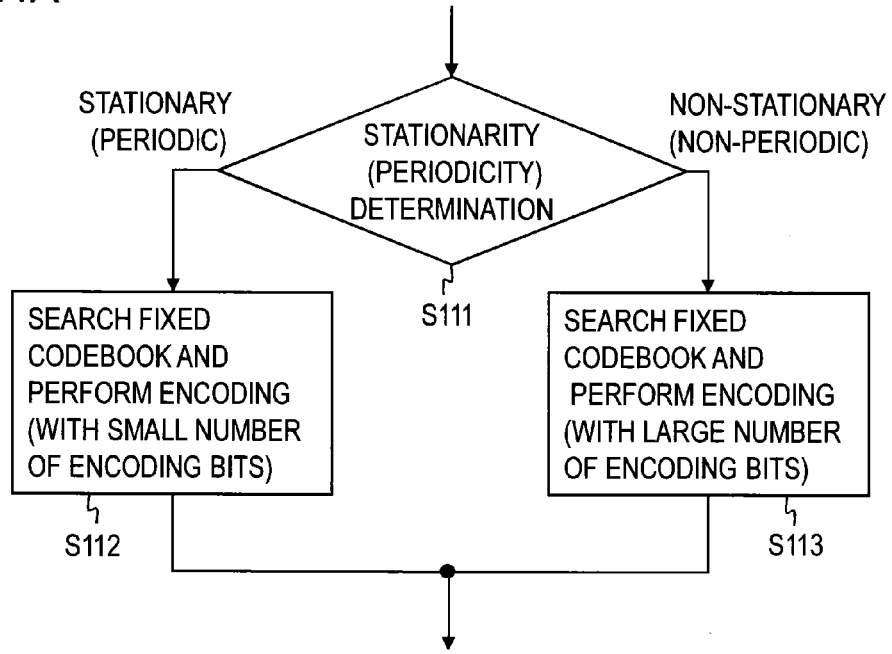
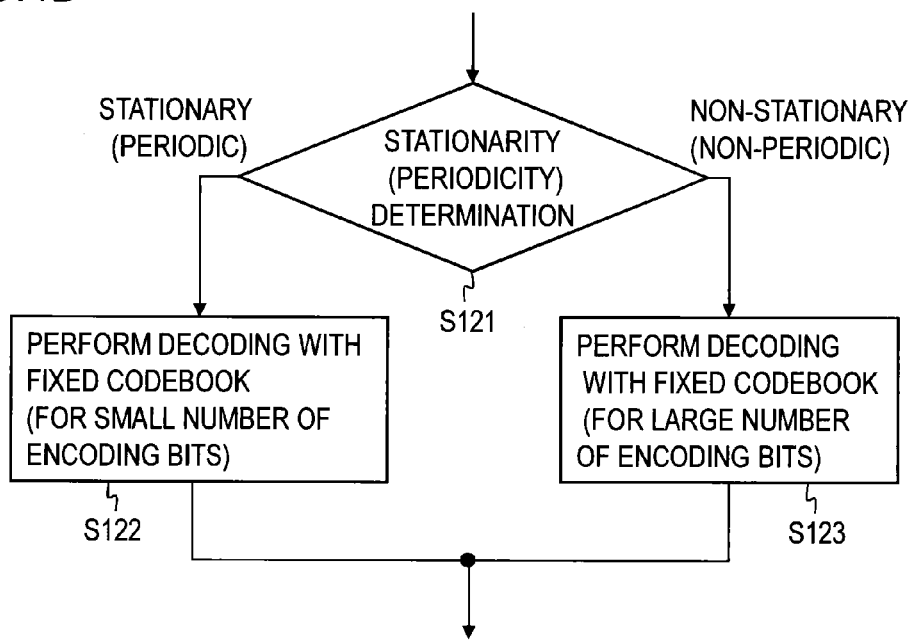

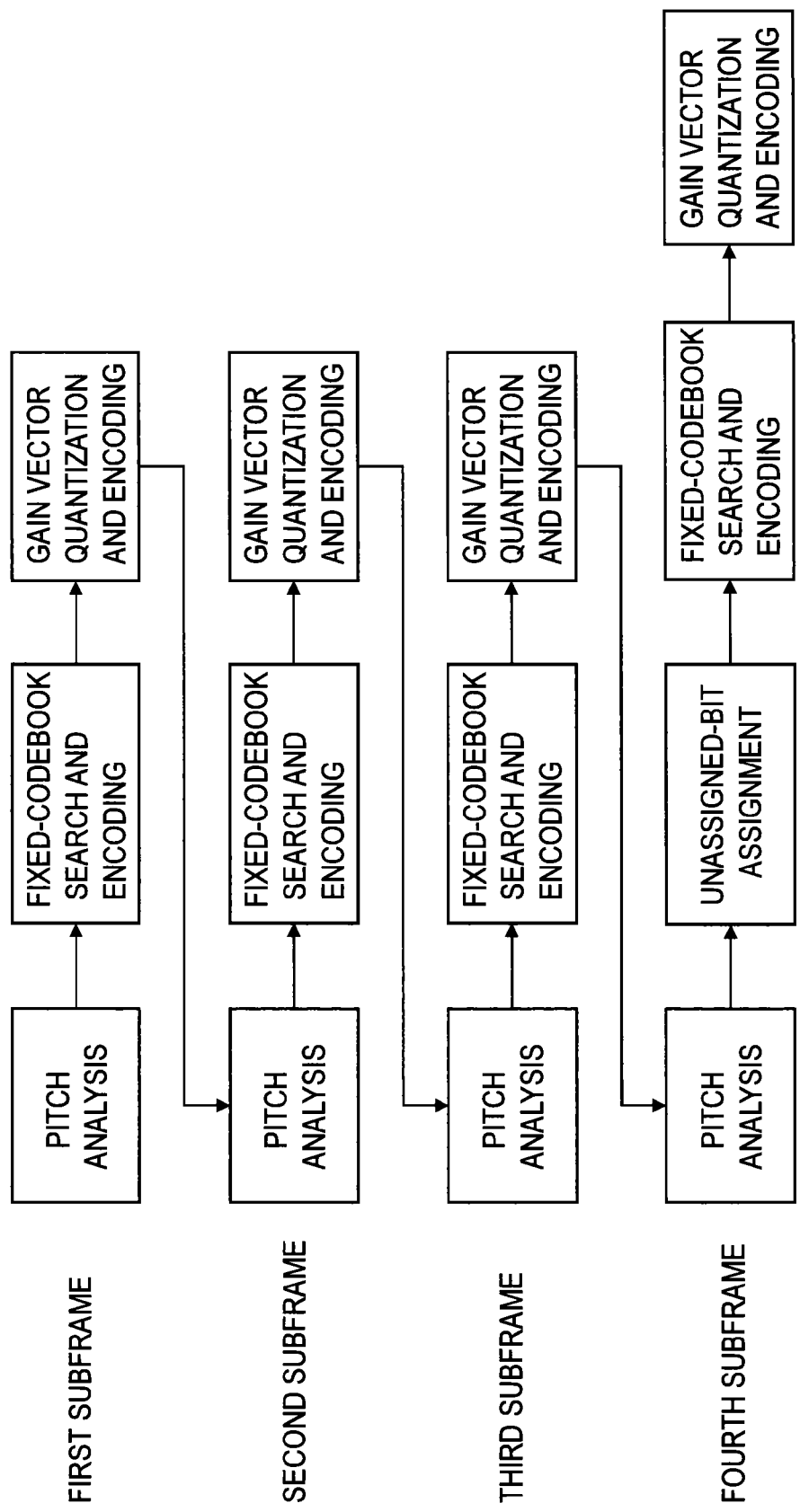

US 9,230,554 B2

ENCODING METHOD FOR ACQUIRING CODES CORRESPONDING TO PREDICTION RESIDUALS, DECODING METHOD FOR DECODING CODES CORRESPONDING TO NOISE OR PULSE SEQUENCE, ENCODER, DECODER, PROGRAM, AND RECORDING MEDIUM

TECHNICAL FIELD

The present invention relates to an encoding-decoding technique, and more specifically, to a technique for encoding and decoding noise and pulse sequences.

BACKGROUND ART

One technique for encoding time series signals such as speech signals and acoustic signals with a small number of bits is code excited linear prediction (CELP), which is used in cell phones and the like. CS-ACELP and 3GPP AMR (refer to non-patent literature 1, for example) defined in ITU-T G.729 are typical CELP techniques.

For encoding and decoding in a predetermined time interval (frame, subframe, etc.), typical CELP techniques use the linear sum of adaptive signal components obtained by delaying one or more excitation signals at a point preceding the predetermined time interval in accordance with a pitch period and a pulse sequence from a fixed codebook, as an excitation signal of the predetermined time interval. The pitch period and pulse sequence are encoded, and a code including the code corresponding to the pitch period and the code corresponding to the pulse sequence is generated.

PRIOR ART LITERATURE NON-PATENT LITERATURE

Non-Patent Literature 1: 3rd Generation Partnership Project (3GPP), Technical Specification (TS) 26.090, "AMR speech codec; Transcoding functions," Version 4.0.0 (2001-03)

SUMMARY OF THE INVENTION

Problems to be Solved by the Invention

The conventional CELP techniques are primarily used in wireless communication, which involves many code errors. Since a change in the number of bits would amplify the damage caused by a code error, the conventional CELP techniques assign a fixed number of bits to the codes corresponding to pulse sequences. There is no need to consider a code error in IP communication. The conventional CELP techniques do not vary the number of bits assigned to codes corresponding to pulse sequences in frames for improved quality.

Means to Solve the Problems

In encoding of the present invention, codes corresponding to noise or a pulse sequence are acquired with the number of bits to be assigned to codes corresponding to prediction residuals (codes corresponding to noise or a pulse sequence) obtained according to prediction analysis applied to time series signals included in a predetermined time interval, being switched according to whether an index that indicates a level of periodicity and/or stationarity corresponding to the predetermined time interval or an interval before the predetermined time interval of input time series signals satisfies a condition that indicates high periodicity and/or high stationarity or a condition that indicates low periodicity and/or low stationarity.

In decoding of the present invention provides, codes corresponding to noise or a pulse sequence included in codes corresponding to a predetermined time interval are decoded to acquire noise or a pulse sequence corresponding to the predetermined time interval with a decoding mode for the codes corresponding to the noise or the pulse sequence being switched according to whether an index that indicates a level of periodicity and/or stationarity, the index being obtained from input codes, satisfies a condition that indicates high periodicity and/or high stationarity or a condition that indicates low periodicity and/or low stationarity.

Effects of the Invention

The level of periodicity and/or stationarity determines the degree of influence of the noise or pulse-sequence encoding resolution on the quality of the entire encoding. Since the number of bits to be assigned to codes corresponding to noise or a pulse sequence are switched according to the level of periodicity and/or stationarity, in the present invention, the compression efficiency can be improved.

BRIEF DESCRIPTION OF THE DRAWINGS

FIG. 4A is a view showing an example of fixed-codebook search in the embodiment, and FIG. 4B is a view showing an example of fixed-codebook decoding in the embodiment;

FIG. 8 is a view illustrating a modification of encoding.

BEST MODES FOR CARRYING OUT THE INVENTION

Figure 1:
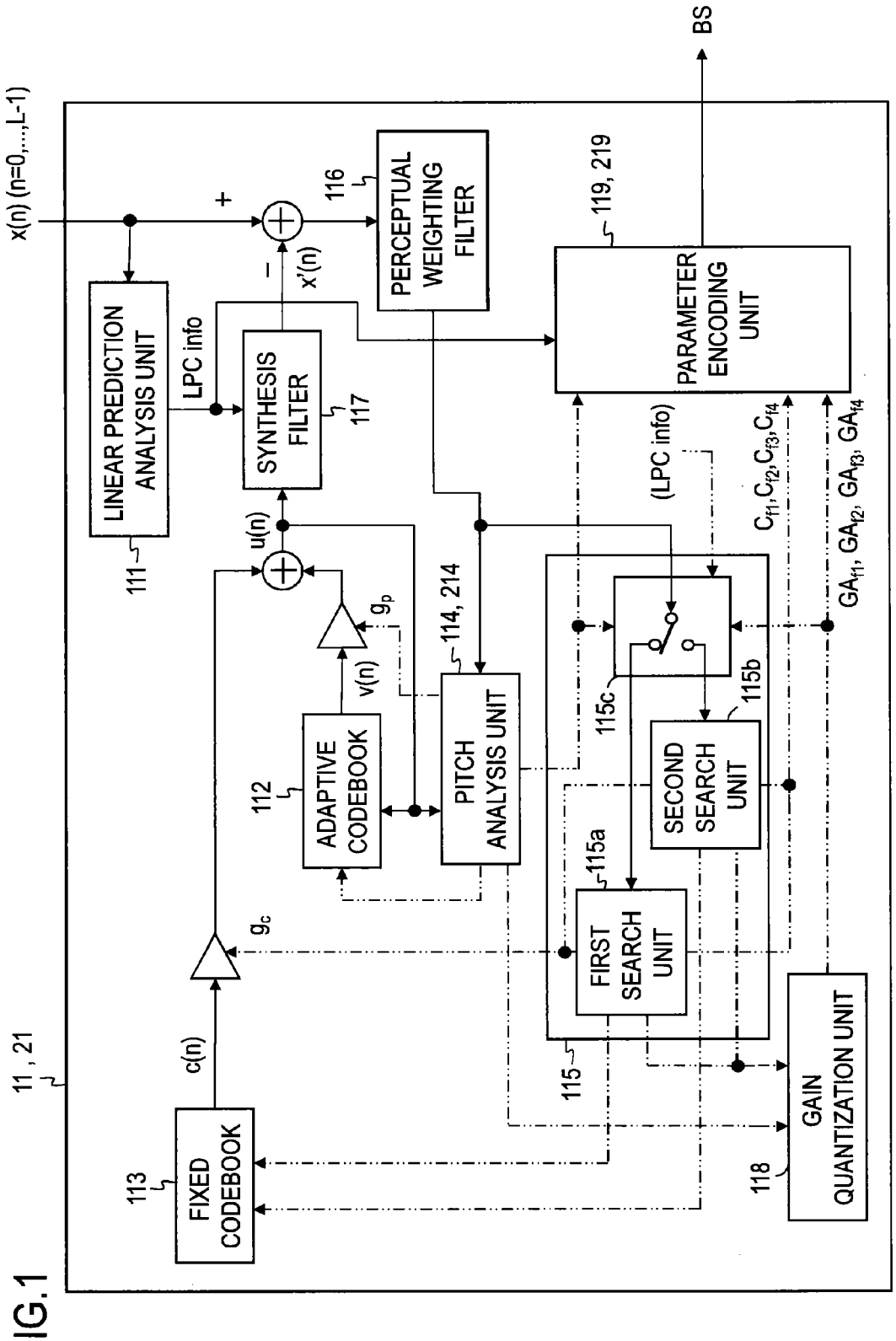
FIG. 1 is a view showing an example of the functional configuration of encoders according to embodiments.

Now, embodiments of the present invention will be described with reference to the drawings.

[Fundamentals]

In encoding in the embodiments, prediction analysis is applied to time series signals included in a predetermined time interval, and codes that include codes corresponding to prediction parameters of the time series signals and codes corresponding to noise or a pulse sequence are obtained. When the codes corresponding to noise or a pulse sequence are obtained, the number of bits to be assigned to codes corresponding to prediction residuals (codes corresponding to noise or a pulse sequence) obtained according to the prediction analysis applied to the time series signals included in the predetermined time interval is switched according to whether an index that indicates a level of periodicity and/or stationarity of the time series signals satisfies a condition that indicates high periodicity and/or high stationarity or a condition that indicates low periodicity and/or low stationarity.

The level of periodicity and/or stationarity determines the degree of influence of noise or pulse sequence encoding resolution on the encoding quality of time series signals (the quality of synthesized signals after decoding relative to the time series signals before encoding).

If the time series signals have low stationarity (referred to as being non-stationary), they also have low periodicity (referred to as being non-periodic) and high noise properties. In such a case, the degree of influence of the encoding resolution of the periodic components of the time series signals on the encoding quality of the time series signals is small. Accordingly, the degree of influence of the encoding resolution of codes corresponding to prediction residuals on the encoding quality of the time series signals becomes relatively large. On the other hand, if the time series signals have high stationarity (referred to as being stationary), they also have high periodicity (referred to as being periodic) and low noise properties. In such a case, the degree of influence of the periodic components of the time series signals on the encoding quality is large. Accordingly, the degree of influence of the encoding resolution of codes corresponding to prediction residuals on the encoding quality of the time series signals becomes relatively small.

The compression efficiency can therefore be improved by switching the number of bits to be assigned to codes corresponding to prediction residuals, according to the level of periodicity and/or stationarity.

More specifically, if time series signals are determined to be stationary (periodic), a small number of bits is assigned to codes corresponding to the prediction residuals; if time series signals are determined to be non-stationary (non-periodic), a large number of bits is assigned to codes corresponding to the prediction residuals.

For example, the number of bits of codes corresponding to prediction residuals obtained when an index that indicates a level of periodicity and/or stationarity of time series signals satisfies a condition that indicates high periodicity and/or high stationarity is made smaller than the number of bits of codes corresponding to prediction residuals obtained when the index that indicates the level of periodicity and/or stationarity of the time series signals does not satisfy the condition that indicates high periodicity and/or high stationarity. Alternatively, for example, the number of bits of codes corresponding to prediction residuals obtained when an index that indicates the level of periodicity and/or stationarity of time series signals satisfies a condition that indicates low periodicity and/or low stationarity is made larger than the number of bits of codes corresponding to prediction residuals obtained when the index that indicates the level of periodicity and/or stationarity of the time series signals does not satisfy the condition that indicates low periodicity and/or low stationarity.

In decoding in the embodiments, a decoding mode for codes corresponding to noise or a pulse sequence included in codes corresponding to a predetermined time interval is switched according to whether an index that indicates a level of periodicity and/or stationarity, the index being obtained from input codes, satisfies a condition that indicates high periodicity and/or high stationarity or a condition that indicates low periodicity and/or low stationarity, and the codes corresponding to the noise or the pulse sequence are decoded to noise or a pulse sequence corresponding to the predetermined time interval.

The fundamentals described above can be applied to any method of performing prediction analysis of time series signals included in a predetermined time interval and obtaining codes that include codes corresponding to prediction parameters and codes corresponding to prediction residuals.

Examples of prediction analysis include short-term prediction analysis such as linear prediction analysis, long-term prediction analysis such as pitch analysis, and analysis in which the two types of analysis described above are performed. Examples of performing both short-term prediction analysis and long-term prediction analysis of time series signals include a method of performing short-term prediction analysis of time series signals to obtain residuals and performing long-term prediction analysis of the residuals or their corresponding values. Examples of prediction parameters include quantized values of linear prediction coefficients, quantized values of coefficients such as PARCOR coefficients or line spectrum pair coefficients that can be transformed to linear prediction coefficients, pitch periods, and quantized pitch gains. Examples of noise or pulse sequences include linear prediction residuals, long-term prediction residuals, residuals obtained when both short-term prediction analysis and long-term prediction analysis are performed, and pulse sequences from a fixed codebook, corresponding to residuals.

In the typical CELP techniques mentioned above, quantized values of coefficients that can be transformed to linear prediction coefficients, pitch periods, and quantized pitch gains, which are obtained from the results of pitch analysis of perceptual weighting values of residuals obtained by linear prediction analysis of time series signals, correspond to prediction parameters, and signal components formed of one or more signals having a value composed of a combination of a non-zero unit pulse from a fixed codebook and its polarity (positive or negative) and one or more signals having a zero value correspond to pulse sequences. Embodiments in which these fundamentals are applied to a typical CELP technique will be described below, but the present invention is not confined to them.

First Embodiment

A first embodiment of the present invention will now be described.

[Configuration]

As shown in FIG. 1, an encoder 11 in the first embodiment includes a linear prediction analysis unit 111, an adaptive codebook 112, a fixed codebook 113, a pitch analysis unit 114, a fixed-codebook search unit 115, a perceptual weighting filter 116, a synthesis filter 117, a gain quantization unit 118, and a parameter encoding unit 119. The fixed-codebook search unit 115 includes a first search unit 115a, a second search unit 115b, and a switch 115c.

Figure 2:
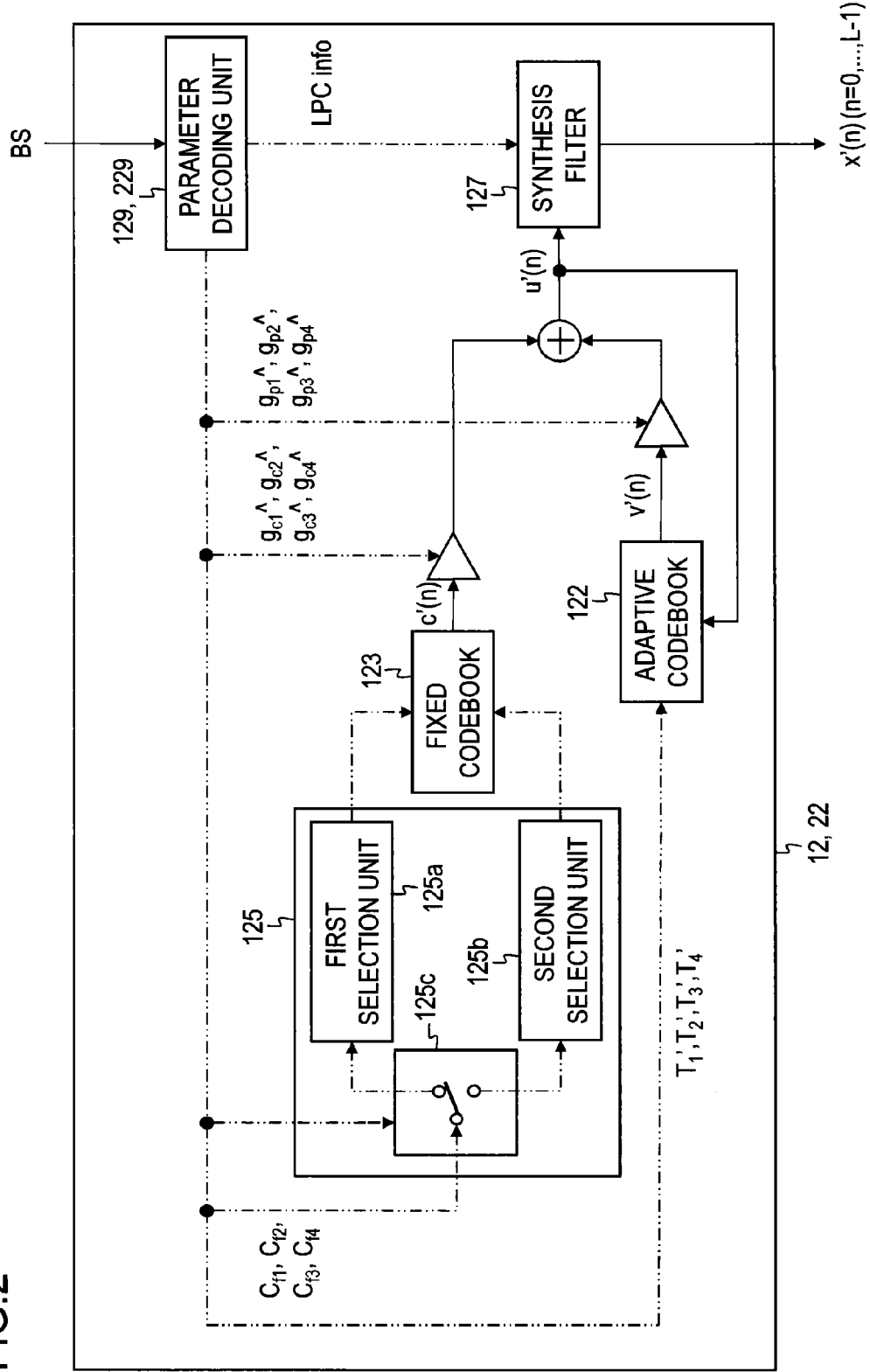
FIG. 2 is a view showing an example of the functional configuration of decoders according to the embodiments.

As shown in FIG. 2, a decoder 12 in the first embodiment includes an adaptive codebook 122, a fixed codebook 123, a fixed codebook selection unit 125, a synthesis filter 127, and a parameter decoding unit 129. The fixed codebook selection unit 125 includes a first selection unit 125a, a second selection unit 125b, and a switch 125c.

The encoder 11 and the decoder 12 in this embodiment are special apparatuses formed when a known computer or a special computer provided with a central processing unit (CPU), a random access memory (RAM), a read-only memory (ROM), and the like reads a program and data. At least a part of the processing units of the encoder 11 and the decoder 12 may be formed by hardware such as an integrated circuit.

[Encoding Method]

The encoder 11 receives time series signals $x(n)$ ($n=0$ to $L-1$; L is an integer equal to 2 or more, each value of n denotes a sample point), such as speech signals and acoustic signals segmented in units of frames, which are predetermined time intervals. The linear prediction analysis unit 111 performs linear prediction analysis of the time series signals $x(n)$ ($n=0$ to $L-1$) at each sample point n ($n=0$ to $L-1$) in the frame to be processed (hereafter called a "current frame") and outputs linear prediction information LPC info (included in prediction parameters), which is codes corresponding to quantized values of coefficients for specifying the all-pole synthesis filter 117 in the current frame. For example, the linear prediction analysis unit 111 calculates linear prediction coefficients $\alpha(m)$ ($m=1$ to $P$; $P$ is a positive integer and a linear prediction order) corresponding to the time series signals $x(n)$ ($n=0$ to $L-1$) in the current frame, converts the linear prediction coefficients $\alpha(m)$ ($m=1$ to $P$) to line spectrum pair coefficients LSP, and outputs codes corresponding to quantized line spectrum pair coefficients LSP as linear prediction information LPC info.

The fixed codebook 113 outputs a pulse sequence formed by one or more signals having a value composed of a combination of a non-zero unit pulse and its polarity and one or more signals having a zero value, in each subframe obtained by dividing a single frame, under the control of the fixed-codebook search unit 115. In an example indicated here, one frame is divided into four equal subframes. That is, a frame having L sample points 0 to $L-1$ has a first subframe having sample points 0 to $L_{f1}-1$, a second subframe having sample points $L_{f1}$ to $L_{f2}-1$, a third frame having sample points $L_{f2}$ to $L_{f3}-1$, and a fourth frame having sample points $L_{f3}$ to $L-1$. $L_{f1}$, $L_{f2}$, and $L_{f3}$ are positive integers that satisfy $0<L_{f1}<L_{f2}<L_{f3}<L$. Pulse sequences $c_{f1}$, $c_{f2}$, $c_{f3}$, and $c_{f4}$ corresponding to the first to fourth subframes are expressed respectively as follows:

$$c_{f1}=c_{f1}(n)(n=0 \text{ to } L_{f1}-1)$$

$$c_{f2}=c_{f2}(n)(n=L_{f1} \text{ to } L_{f2}-1)$$

$$c_{f3}=c_{f3}(n)(n=L_{f2} \text{ to } L_{f3}-1)$$

$$c_{f4}=c_{f4}(n)(n=L_{f3} \text{ to } L-1)$$

The adaptive codebook 112 stores excitation signals generated at preceding points. The adaptive codebook 112 outputs adaptive signal components $v(n)$ ($n=0$ to $L-1$) that can be obtained by using excitation signals delayed in accordance with pitch periods $T_1$, $T_2$, $T_3$, and $T_4$ obtained in individual subframes, that is, the first to fourth subframes. Excitation signals $u(n)$ ($n=0$ to $L-1$) corresponding to the pulse sequences from the fixed codebook 113 and the adaptive signal components from the adaptive codebook 112 are as follows:

$$u(n)=g_{p1}\cdot v(n)+g_{c1}\cdot c_{f1}(n)(n=0 \text{ to } L_{f1}-1)$$

$$u(n)=g_{p2}\cdot v(n)+g_{c2}\cdot c_{f2}(n)(n=L_{f1} \text{ to } L_{f2}-1)$$

$$u(n)=g_{p3}\cdot v(n)+g_{c3}\cdot c_{f3}(n)(n=L_{f2} \text{ to } L_{f3}-1)$$

$$u(n)=g_{p4}\cdot v(n)+g_{c4}\cdot c_{f4}(n)(n=L_{f3} \text{ to } L-1)$$

Here, $g_{p1}$, $g_{p2}$, $g_{p3}$, and $g_{p4}$ are pitch gains given to the adaptive signal components $v(n)$ in the first to fourth subframes, respectively, and $g_{c1}$, $g_{c2}$, $g_{c3}$, and $g_{c4}$ are fixed-codebook gains given to the pulse sequences $c_{f1}$, $c_{f2}$, $c_{f3}$, and $c_{f4}$ in the first to fourth subframes, respectively. The pitch gains and fixed-codebook gains are generically referred to as excitation gains.

The pitch analysis unit 114 obtains the pitch periods $T_1$, $T_2$, $T_3$, and $T_4$ and the pitch gains $g_{p1}$, $g_{p2}$, $g_{p3}$, and $g_{p4}$, respectively, in the first to fourth subframes. The fixed-codebook search unit 115 obtains the pulse sequences $c_{f1}$, $c_{f2}$, $c_{f3}$, and $c_{f4}$ and the fixed-codebook gains $g_{c1}$, $g_{c2}$, $g_{c3}$, and $g_{c4}$ in the first to fourth subframes, respectively. The pitch periods $T_1$, $T_2$, $T_3$, and $T_4$, the pitch gains $g_{p1}$, $g_{p2}$, $g_{p3}$, and $g_{p4}$, the pulse sequences $c_{f1}$, $c_{f2}$, $c_{f3}$, and $c_{f4}$, and the fixed-codebook gains $g_{c1}$, $g_{c2}$, $g_{c3}$, and $g_{c4}$ are calculated, for example, to minimize values obtained by applying the perceptual weighting filter 116 to the differences between the input time series signals $x(n)$ ($n=0$ to $L-1$) and the synthesized signals $x'(n)$ ($n=0$ to $L-1$) obtained by applying the all-pole synthesis filter 117 specified by the linear prediction information LPC info to the excitation signals $u(n)$ ($n=0$ to $L-1$). The pitch periods are expressed as integer multiples of intervals between sample points (integer resolution) or by using integer multiples of intervals between sample points and fractional values (fractional resolution). If adaptive signal components $v(n)$ are expressed by using pitch periods with fractional resolution, an interpolation filter that performs weighted averaging of a plurality of excitation signals delayed in accordance with the pitch periods is used. The pitch analysis unit 114 outputs the pitch periods $T_1$, $T_2$, $T_3$, and $T_4$ and the pitch gains $g_{p1}$, $g_{p2}$, $g_{p3}$, and $g_{p4}$. The fixed-codebook search unit 115 outputs the fixed-codebook gains $g_{c1}$, $g_{c2}$, $g_{c3}$, and $g_{c4}$ and code indices $C_{f1}$, $C_{f2}$, $C_{f3}$, and $C_{f4}$, which are codes corresponding respectively to the pulse sequences $c_{f1}$, $c_{f2}$, $c_{f3}$, and $c_{f4}$. Search and encoding of the pulse sequences $c_{f1}$, $c_{f2}$, $c_{f3}$, and $c_{f4}$ in this embodiment are characteristic features and will be described later.

The pitch gains $g_{p1}$, $g_{p2}$, $g_{p3}$, and $g_{p4}$ and the fixed-codebook gains $g_{c1}$, $g_{c2}$, $g_{c3}$, and $g_{c4}$ are input to the gain quantization unit 118. The gain quantization unit 118 quantizes the pitch gains $g_{p1}$, $g_{p2}$, $g_{p3}$, and $g_{p4}$ and the fixed-codebook gains $g_{c1}$, $g_{c2}$, $g_{c3}$, and $g_{c4}$ and outputs codes such as indices specifying quantized pitch gains $\hat{g}_{p1}$, $\hat{g}_{p2}$, $\hat{g}_{p3}$, and $\hat{g}_{p4}$ and codes such as indices specifying quantized fixed-codebook gains $\hat{g}_{c1}$, $\hat{g}_{c2}$, $\hat{g}_{c3}$, and $\hat{g}_{c4}$. The codes corresponding to the quantized pitch gains $\hat{g}_{p1}$, $\hat{g}_{p2}$, $\hat{g}_{p3}$, and $\hat{g}_{p4}$ and the quantized fixed-codebook gains $\hat{g}_{c1}$, $\hat{g}_{c2}$, $\hat{g}_{c3}$, and $\hat{g}_{c4}$ will be expressed below as quantized excitation gain codes $GA_{f1}$, $GA_{f2}$, $GA_{f3}$, and $GA_{f4}$. For example, if a code corresponding to a quantized pitch gain $\hat{g}_{pj}$ and a code corresponding to a quantized fixed-codebook gain $\hat{g}_{cj}$ are separately obtained in a j-th subframe ($j=1$ to 4), the combination of the code corresponding to the quantized pitch gain $\hat{g}_{pj}$ and the code corresponding to the quantized fixed-codebook gain $\hat{g}_{cj}$ will be expressed as a quantized excitation gain code $GA_{fj}$. If the quantized pitch gains $\hat{g}_{p1}$, $\hat{g}_{p2}$, $\hat{g}_{p3}$, and $\hat{g}_{p4}$ are encoded together in a single frame and if the quantized fixed-codebook gains $\hat{g}_{c1}$, $\hat{g}_{c2}$, $\hat{g}_{c3}$, and $\hat{g}_{c4}$ are encoded together in a single frame, the combinations of codes corresponding to the quantized pitch gains $\hat{g}_{p1}$, $\hat{g}_{p2}$, $\hat{g}_{p3}$, and $\hat{g}_{p4}$ and codes corresponding to the quantized fixed-codebook gains $\hat{g}_{c1}$, $\hat{g}_{c2}$, $\hat{g}_{c3}$, and $\hat{g}_{c4}$ will be expressed as quantized excitation gain codes $GA_{f1}$, $GA_{f2}$, $GA_{f3}$, and $GA_{f4}$.

The combinations of pitch gains and fixed-codebook gains may also be vector-quantized and encoded. If the combinations of pitch gains and fixed-codebook gains are vector-quantized and encoded, codes such as indices are associated with the combinations of quantized pitch gains and quantized fixed-codebook gains. The combinations of quantized pitch gains and quantized fixed-codebook gains obtained by vector quantization are referred to as quantized gain vectors, and the codes obtained by vector quantization are referred to as vector-quantized gain codes (VQ gain codes). The VQ gain code is an example of a quantized excitation gain code. That type of vector quantization may associate a single VQ gain code with the combination of a quantized pitch gain and a quantized fixed-codebook gain corresponding to the same subframe, may associate a single VQ gain code with the combination of a quantized pitch gain and a quantized fixed-codebook gain corresponding to each of a plurality of subframes, or may associate a single VQ gain code with the combination of a quantized pitch gain and a quantized fixed-codebook gain corresponding to the same frame.

That type of vector quantization uses a table (two-dimensional codebook) for specifying VQ gain codes corresponding to combinations of quantized pitch gains and quantized fixed-codebook gains, for example. An example of the two-dimensional codebook is a table in which combinations of quantized pitch gains and quantized fixed-codebook gains are associated with VQ gain codes. Another example of the two-dimensional codebook is a table in which combinations of quantized pitch gains and quantized values of values corresponding to fixed-codebook gains are associated with VQ gain codes. Examples of values corresponding to fixed-codebook gains include a correction factor representing the ratio between an estimated value of a fixed-codebook gain in the current subframe (or frame) predicted from the energy of the signal component from the fixed codebook 113 in a preceding subframe (frame) and a fixed-codebook gain in the current subframe (or frame). Examples of correction factors include $\gamma_{gc}$ specified in 5.8.2, "Quantization of codebook gains" in Non-Patent Literature 1. For example, the following relation holds for the fixed-codebook gain $g_{cj}$ in the j-th subframe (j=1 to 4), the correction factor $\gamma_{gc}$, and the estimated value $pg_{cj}$ of the fixed-codebook gain in the j-th subframe (j=1 to 4):

$$g_{cj} = \gamma_{gc} \times pg_{cj}$$

The two-dimensional codebook may be a single table or may be formed by a plurality of tables, like the two-stage conjugate structured codebook in Reference 1, "ITU-T Recommendation G.729, "Coding of Speech at 8 kbit/s using Conjugate-Structure Algebraic-Code-Excited Linear-Prediction (CS-ACELP)." If the two-dimensional codebook is composed of a plurality of tables, a VQ gain code corresponding to a combination of a quantized pitch gain and a quantized fixed-codebook gain is a combination of indices specified in each table composing the two-dimensional codebook with respect to the combination of the quantized pitch gain and the quantized fixed-codebook gain, for example.

Figure 3:
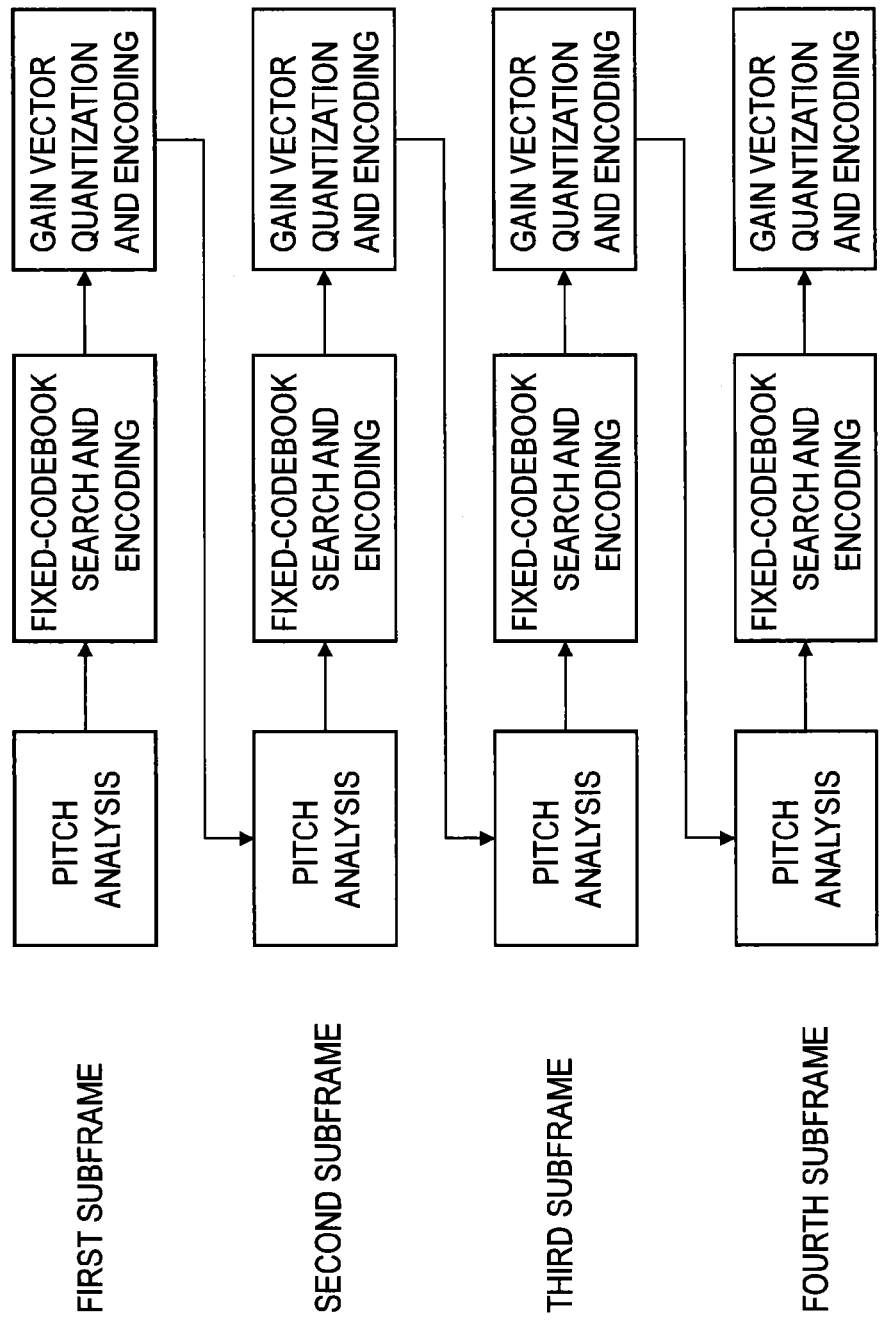
FIG. 3 is a view showing an example of encoding in an embodiment.

FIG. 3 shows an example in which a pitch gain and a fixed-codebook gain are quantized and encoded in subframes. In the example shown in FIG. 3, the pitch analysis unit 114 first performs pitch analysis by using the adaptive codebook 112 and obtains a pitch period $T_j$ and a pitch gain $g_{pj}$ (pitch analysis), the fixed-codebook search unit 115 searches through the fixed codebook 113 to find a pulse sequence $c_{fj}$, a code index $C_{fj}$ corresponding thereto, and a fixed-codebook gain $g_{cj}$ (fixed-codebook search and encoding), and the gain quantization unit 118 vector-quantizes the combination of the pitch gain $g_{pj}$ and the fixed-codebook gain $g_{cj}$ and obtains a quantized excitation gain code $GA_{fj}$, which is a VQ gain code corresponding to a quantized gain vector composed of a quantized pitch gain $\hat{g}_{pj}$ and a quantized fixed-codebook gain $\hat{g}_{fj}$ (gain vector quantization and encoding), in each j-th subframe (j=1 to 4).

Excitation parameters including the linear prediction information LPC info, the pitch periods $T_1$, $T_2$, $T_3$, and $T_4$, the code indices $C_{f1}$, $C_{f2}$, $C_{f3}$, and $C_{f4}$, and the quantized excitation gain codes $GA_{f1}$, $GA_{f2}$, $GA_{f3}$, and $GA_{f4}$ are input to the parameter encoding unit 119. The parameter encoding unit 119 obtains a pitch period code $C_T$ by encoding the pitch periods $T_1$, $T_2$, $T_3$, and $T_4$ and generates and outputs a bit stream BS, which is a code corresponding to the input excitation parameters.

[Pulse Sequence Search and Encoding]

Search and encoding of pulse sequences $c_{f1}$, $c_{f2}$, $c_{f3}$, and $c_{f4}$ (pulse sequences corresponding to prediction residuals obtained according to prediction analysis of time series signals included in a predetermined time interval) from the fixed codebook 113, which are characteristic features of this embodiment, will be described next.

As shown in an example in FIG. 4A, in the search and encoding of the pulse sequences $c_{f1}$, $c_{f2}$, $c_{f3}$, and $c_{f4}$ in this embodiment, the switch 115c determines whether an index that indicates a level of periodicity and/or stationarity of the time series signals satisfies a condition that indicates high periodicity and/or high stationarity or a condition that indicates low periodicity and/or low stationarity (step S111) to select whether the first search unit 115a performs fixed-codebook search (hereafter called "first fixed-codebook search") and encoding (hereafter called "first encoding") corresponding to codes having a small number of bits (step S112, with a small number of encoding bits), or the second search unit 115b performs fixed-codebook search (hereafter called "second fixed-codebook search") and encoding (hereafter called "second encoding") corresponding to codes having a large number of bits (step S113, with a large number of encoding bits).

Specifically, when the switch 115c determines that the signals are stationary (periodic), the first search unit 115a performs the first fixed-codebook search only for pulse sequences that can be expressed with code indices (codes) having a first number R1, which is small, of bits, obtains, by the first encoding, code indices corresponding to the pulse sequences obtained by the first fixed-codebook search, and outputs the code indices (step S112). When the switch 115c determines that the signals are non-stationary (non-periodic), the second search unit 115b performs the second fixed-codebook search for pulse sequences that can be expressed with code indices having a second number R2, which is large (R2>R1), of bits, obtains, by the second encoding, code indices corresponding to the pulse sequences obtained by the second fixed-codebook search, and outputs the code indices (step S113).

In summary, the number of bits of code indices corresponding respectively to pulse sequences that are obtained when the index that indicates the level of periodicity and/or stationarity of the time series signals satisfies the condition that indicates high periodicity and/or high stationarity (step S112) is smaller than the number of bits of code indices corresponding respectively to pulse sequences that are obtained when the index that indicates the level of periodicity and/or stationarity of the time series signals does not satisfy the condition that indicates high periodicity and/or high stationarity (step S113). Alternatively, the number of bits of code indices corresponding to pulse sequences that are obtained when the index that indicates the level of periodicity and/or stationarity of the time series signals satisfies the condition that indicates low periodicity and/or low stationarity (step S113) is larger than the number of bits of code indices corresponding to pulse sequences that are obtained when an index that indicates the level of periodicity and/or stationarity of the time series signals does not satisfy the condition that indicates low periodicity and/or low stationarity (step S112).

Specific cases of processing in steps S111 to S113 will be described next.

[Specific Case 1 of Step S111]

In specific case 1 of step S111, as an index that indicates a level of stationarity (periodicity) of time series signals, an estimated value of a prediction gain, which is the ratio of the magnitudes of the time series signals to the magnitudes of the prediction residuals obtained by linear prediction analysis of the time series signals is used.

The switch 115c in this case determines that the signals are stationary (periodic) when the condition that the estimated value of the prediction gain is larger than a specified value (a condition that indicates high periodicity and/or high stationarity) is satisfied and determines that the signals are non-stationary (non-periodic) when the condition is not satisfied. Alternatively, the switch 115c in this case determines that the signals are stationary (periodic) when the condition that the estimated value of the prediction gain is smaller than the specified value (a condition that indicates low periodicity and/or low stationarity) is not satisfied and determines that the signals are non-stationary (non-periodic) when the condition is satisfied. The basis of the determination is that, in a time interval in which the signals are stationary (periodic), since the linear prediction is effective, the prediction residuals are small, and the ratio of the magnitudes of the time series signals to the magnitudes of the prediction residuals becomes large.

For example, an estimated value of a prediction gain determined by quantized PARCOR coefficients or their corresponding values is used as an index. Specifically, the estimated value E of the prediction gain given by the following expression (1) is used as the index, for example.

$$E = 1 \bigg/ \prod_{m=1}^{P} (1 - k_m^2) \qquad (1)$$

Here, $k_m$ in Expression (1) is an m-th order quantized PARCOR coefficient specified by the linear prediction information LPC info. The value of Expression (1) non-decreases (increases weakly and monotonically) with respect to the magnitude of the m-th order quantized PARCOR coefficient. In this example, the linear prediction information LPC info is input to the switch 115c. The switch 115c checks whether the estimated value E of the prediction gain obtained from the linear prediction information LPC info is larger than a specified value, and determines that the signals are stationary (periodic) when that condition is satisfied or determines that the signals are non-stationary (non-periodic) when that condition is not satisfied. Alternatively, the switch 115c checks whether the estimated value E of the prediction gain obtained from the linear prediction information LPC info is smaller than the specified value, and determines that the signals are stationary (periodic) when the condition is not satisfied or determines that the signals are non-stationary (non-periodic) when the condition is satisfied.

Step S111 in this case may be executed in each frame or may be executed in each subframe of the frame. Linear prediction analysis of time series signals for obtaining the index in this case may be executed in each frame or may be executed in each subframe. A time interval in which linear prediction analysis is performed to obtain the index in this case may coincide with, may overlap, or may not overlap a time interval in which fixed-codebook search and encoding are performed in accordance with the result of a determination made by using the index.

For example, an estimated value of a prediction gain may be obtained in each frame; it may be determined whether the signals are stationary (periodic) or non-stationary (non-periodic) by using the estimated value of prediction gain in the current frame as an index; and it may be selected according to the result of the determination whether to perform the first fixed-codebook search and the first encoding or the second fixed-codebook search and the second encoding in the current frame. Alternatively, an estimated value of a prediction gain in a frame before the current frame (the immediately preceding frame, for example) may be used as an index to determine whether the signals are stationary (periodic) or non-stationary (non-periodic); and it may be selected according to the result of the determination whether to perform the first fixed-codebook search and the first encoding or the second fixed-codebook search and the second encoding in the current frame. Alternatively, an estimated value of a prediction gain obtained in each subframe may be used as an index to determine whether the signals are stationary (periodic) or non-stationary (non-periodic); and it may be selected according to the result of the determination whether to perform the first fixed-codebook search and the first encoding or the second fixed-codebook search and the second encoding in the subframe or a subframe after the subframe (the immediately following subframe, for example).

It may be determined whether α is larger than a specified value by checking whether α>specified value is satisfied, and it may be determined whether α is larger than the specified value by checking whether α≥(specified value+constant) is satisfied. In these cases, the specified value may be specified as a threshold in the process, and (specified value+constant) may be specified as the threshold in the process.

In the same manner, it may be determined whether α is smaller than a specified value by checking whether α<specified value is satisfied, and it may be determined whether α is smaller than the specified value by checking whether α≤(specified value−constant) is satisfied. In these cases, the specified value may be specified as a threshold in the process, and (specified value−constant) may be specified as the threshold in the process. These also apply to the other determinations, which will be described later.

[Specific Case 2 of Step S111]

Specific case 2 of step S111 uses a quantized PARCOR coefficient or its corresponding value as an index that indicates a level of stationarity (periodicity) of time series signals.

Information (linear prediction information LPC info, for example) for obtaining the magnitude of a quantized PARCOR coefficient or its corresponding value is input to the switch 115c in this case. The switch 115c determines that the signals are stationary (periodic) when the condition that the magnitude of the quantized PARCOR coefficient obtained from the input information or its corresponding value is larger than a specified value (a condition that indicates high periodicity and/or high stationarity) is satisfied, and determines that the signals are non-stationary (non-periodic) when the condition is not satisfied. Alternatively, the switch 115c determines that the signals are stationary (periodic) when the condition that the magnitude of the quantized PARCOR coefficient or its corresponding value is smaller than the specified value (a condition that indicates low periodicity and/or low stationarity) is not satisfied, and determines that the signals are non-stationary (non-periodic) when the condition is satisfied. The basis of the determinations is that the magnitude of the PARCOR coefficient is likely to increase in a time interval in which the signals are stationary (periodic).

For example, the magnitude of an m'-th order quantized PARCOR coefficient $k_{m'}$ (m'=1, for example) or the magnitude of a value corresponding to the quantized PARCOR coefficient $k_m$, may be used as an index, a value corresponding to the magnitudes of a plurality of quantized PARCOR coefficients $k_m$ may be used as an index, an estimated value of the prediction gain given by Expression (1) may be used as an index, and a value of another non-decreasing function (weakly monotonically increasing function) corresponding to the quantized PARCOR coefficients may be used as an index. Examples of a value corresponding to the magnitudes of a plurality of $\alpha$'s include the average of the magnitudes of the plurality of $\alpha$'s, the sum of the magnitudes of the plurality of $\alpha$'s, and the weighted sum of the magnitudes of the plurality of $\alpha$'s. Examples of the magnitude of $\alpha$ include the amplitude, the absolute value, the energy, and a power of $\alpha$. These examples also apply to the other indices, which will be described later.

Step S111 in this case may be executed in each frame or may be executed in each subframe. Linear prediction analysis of time series signals for obtaining an index in this case may be executed in each frame or may be executed in each subframe. A time interval in which linear prediction analysis is performed to obtain an index in this case may coincide with, may overlap, or may not overlap a time interval in which fixed-codebook search and encoding are performed in accordance with the result of a determination made by using the index.

For example, a quantized PARCOR coefficient or its corresponding value may be obtained in each frame, the signals may be determined to be stationary (periodic) or non-stationary (non-periodic) by using the quantized PARCOR coefficient or its corresponding value in the current frame as an index, and it may be selected according to the result of the determination whether to perform the first fixed-codebook search and the first encoding or the second fixed-codebook search and the second encoding. Alternatively, it may be determined whether the signals are stationary (periodic) or non-stationary (non-periodic) by using a quantized PARCOR coefficient or its corresponding value in a frame before the current frame (the immediately preceding frame, for example) as an index, and it may be selected according to the result of the determination whether to perform the first fixed-codebook search and the first encoding or the second fixed-codebook search and the second encoding in the current frame. Alternatively, it may be determined whether the signals are stationary (periodic) or non-stationary (non-periodic) by using a quantized PARCOR coefficient obtained in each subframe or its corresponding value as an index, and it may be selected accordingly whether to perform the first fixed-codebook search and the first encoding or the second fixed-codebook search and the second encoding in the subframe or a subsequent subframe (the immediately following subframe, for example).

[Specific Case 3 of Step S111]

Specific case 3 of step S111 uses a quantized pitch gain or its corresponding value as an index that indicates a level of stationarity (periodicity) of time series signals. Examples of values corresponding to the quantized pitch gain include the average of quantized pitch gains and a value of a non-decreasing function (weakly monotonically increasing function) with respect to the magnitude of the quantized pitch gain.

In this case, information (quantized pitch gains, or quantized excitation gain codes such as VQ gain codes, for example) for obtaining a quantized pitch gain or its corresponding value is input to the switch 115c. The switch 115c determines that the signals are stationary (periodic) when the condition that the quantized pitch gain obtained from the input information or its corresponding value is larger than a specified value (a condition that indicates high periodicity and/or high stationarity) is satisfied, and determines that the signals are non-stationary (non-periodic) when the condition is not satisfied. Alternatively, the switch 115c determines that the signals are stationary (periodic) when the condition that the quantized pitch gain or its corresponding value is smaller than the specified value (a condition that indicates low periodicity and/or low stationarity) is not satisfied, and determines that the signals are non-stationary (non-periodic) when the condition is satisfied. The basis of the determinations is that, in a time interval in which the signals are stationary (periodic), the pitch periods are highly periodic, and the pitch gains are large.

Step S111 in this case may be executed in each frame or may be executed in each subframe. Pitch analysis, quantization, and encoding for obtaining an index in this case may also be executed in each frame or may be executed in each subframe. A time interval in which pitch analysis and the like is performed to obtain an index in this case may coincide with, may overlap, or may not overlap a time interval in which fixed-codebook search and encoding are performed in accordance with the result of a determination made by using the index. If information for obtaining a quantized pitch gain or its corresponding value is a VQ gain code, the quantized pitch gain or its corresponding value to be used in step S111 in this case must be taken from a preceding subframe or frame. The reason lies in the order of processes in each frame or each subframe: The fixed-codebook search unit 115 determines pulse sequences and obtains fixed-codebook gains in accordance with the determined pulse sequences, and the gain quantization unit 118 obtains quantized fixed-codebook gains and VQ gain codes on the basis of the fixed-codebook gains, in that order, and the determination in step S111 cannot be made in each frame or subframe on the basis of the VQ gain code of the frame or subframe.

For example, if a pitch gain and a fixed-codebook gain are vector-quantized and encoded, a quantized pitch gain corresponding to a VQ gain code in a subframe before the current target frame of fixed-codebook search and encoding (the immediately preceding subframe, for example) may be supplied from the gain quantization unit 118 in each subframe, it may be determined whether the signals are stationary (periodic) or non-stationary (non-periodic) by using the quantized pitch gain or its corresponding value as an index, and it may be selected according to the result of the determination whether to perform the first fixed-codebook search and the first encoding or the second fixed-codebook search and the second encoding in the current subframe. If a pitch gain and a fixed-codebook gain are encoded separately, a quantized pitch gain in the current subframe may be supplied from the gain quantization unit 118, it may be determined whether the signals are stationary (periodic) or non-stationary (non-periodic) by using the quantized pitch gain in the current subframe or its corresponding value as an index, and it may be selected according to the result of the determination whether to perform the first fixed-codebook search and the first encoding or the second fixed-codebook search and the second encoding in the current subframe. Further, a fixed number of bits may be assigned to a code index $C_{f1}$ in a first subframe located at the beginning of a frame; and in the first subframe, the determination in step S111 may not be made, and fixed-codebook search and encoding may be applied to pulse sequences that can be expressed with the code index $C_{f1}$ having the fixed number of bits. In that case, the determination in step S111 is made only in the second and subsequent subframes.

It may also be determined whether the signals are stationary (periodic) or non-stationary (non-periodic) by using a quantized pitch gain in a single subframe (a first subframe, for example) included in the current frame or a preceding frame (the immediately preceding frame, for example) or its corresponding value as an index, and it may be selected according to the result of the determination whether to perform the first fixed-codebook search and the first encoding or the second fixed-codebook search and the second encoding in the current frame. If the determination uses the quantized pitch gain having the smallest magnitude among the quantized pitch gains in the subframes included in the frame, the determination using the quantized pitch gain in a single subframe included in a preceding frame would work well.

Alternatively, if all the quantized pitch gains in the subframes included in a preceding frame (the frame immediately preceding the current frame, for example) are larger than a specified value, the signals may be determined to be stationary (periodic), and the first fixed-codebook search and the first encoding may be selected in the current frame; otherwise, the signals may be determined to be non-stationary (non-periodic), and the second fixed-codebook search and the second encoding may be selected in the current frame. Alternatively, if a specified number of quantized pitch gains or more in a preceding frame are larger than a specified value, the signals may be determined to be stationary (periodic), and the first fixed-codebook search and the first encoding may be selected in the current frame; otherwise, the signals may be determined to be non-stationary (non-periodic), and the second fixed-codebook search and the second encoding may be selected in the current frame.

Alternatively, if all the quantized pitch gains in the subframes included in a preceding frame are smaller than the specified value, the signals may be determined to be non-stationary (non-periodic), and the second fixed-codebook search and the second encoding may be selected in the current frame; otherwise, the signals may be determined to be stationary (periodic), and the first fixed-codebook search and the first encoding may be selected in the current frame. Alternatively, if a specified number of quantized pitch gains or more in a preceding frame are smaller than the specified value, the signals may be determined to be non-stationary (non-periodic), and the second fixed-codebook search and the second encoding may be selected in the current frame; otherwise, the signals may be determined to be stationary (periodic), and the first fixed-codebook search and the first encoding may be selected in the current frame.

The signals may also be determined to be stationary (periodic) or non-stationary (non-periodic) by using a quantized pitch gain in the first subframe included in the current frame or its corresponding value as an index, and it may be selected according to the result of the determination whether to perform the first fixed-codebook search and the first encoding or the second fixed-codebook search and the second encoding in all the subframes other than the first subframe in the current frame. In that case, a fixed number of bits may be assigned to the code index $C_{f1}$ in the first subframe. Alternatively, the determination may be made by using the quantized pitch gain in a preceding frame or in a subframe included in that frame or its corresponding value as an index, and it may be selected accordingly whether to perform the first fixed-codebook search and the first encoding or the second fixed-codebook search and the second encoding in the first subframe.

Alternatively, the signals may also be determined to be stationary (periodic) or non-stationary (non-periodic) by using a value corresponding to the magnitudes of a plurality of quantized pitch gains in a plurality of subframes in the current frame or a preceding frame as an index, and it may be selected according to the result of the determination whether to perform the first fixed-codebook search and the first encoding or the second fixed-codebook search and the second encoding in the current frame or in subframes included in that frame.

[Specific Case 4 of Step S111]

Specific case 4 of step S111 uses a quantized pitch gain or its corresponding value and a quantized fixed-codebook gain or its corresponding value as indices that indicate a level of periodicity (stationarity) of time series signals. Examples of values corresponding to the quantized fixed-codebook gain include a quantized correction factor, which has been described earlier. Examples of values corresponding to the quantized pitch gain include the average of quantized pitch gains and a value of a non-decreasing function (weakly monotonically increasing function) with respect to the magnitudes of quantized pitch gains.

Information (a quantized fixed-codebook gain and a quantized pitch gain, or a quantized excitation gain code such as a VQ gain code, for example) for obtaining a quantized fixed-codebook gain or its corresponding value and a quantized pitch gain or its corresponding value is input to the switch 115c in this case. If the condition that indicates that the ratio of the quantized pitch gain or its corresponding value to the quantized fixed-codebook gain or its corresponding value, obtained from the input information, is larger than a specified value (a condition that indicates high periodicity and/or high stationarity) is satisfied, the switch 115c determines that the signals are stationary (periodic); and if the condition is not satisfied, the switch 115c determines that the signals are non-stationary (non-periodic). Alternatively, if the condition that indicates that the ratio of the quantized pitch gain or its corresponding value to the quantized fixed-codebook gain or its corresponding value is smaller than the specified value (a condition that indicates low periodicity and/or low stationarity) is not satisfied, the switch 115c determines that the signals are stationary (periodic); and if the condition is satisfied, switch 115c determines that the signals are non-stationary (non-periodic). The basis of the determinations is that, in a time interval in which the signals are stationary (periodic), the pitch periods are highly periodic, and the ratios of the quantized pitch gains or their corresponding values to the quantized fixed-codebook gains or their corresponding values are large.

Step S111 in this case may be executed in each frame or may be executed in each subframe. Pitch analysis, fixed-codebook search, quantization, and encoding for obtaining an index in this case may also be executed in each frame or may be executed in each subframe. A time interval in which pitch analysis, fixed-codebook search, and the like is performed to obtain an index in this case is before a time interval in which fixed-codebook search and encoding are performed in accordance with the result of determination made by using the index. The reason lies in the order of processes in each frame or each subframe: The fixed-codebook search unit 115 determines pulse sequences and obtains fixed-codebook gains in accordance with the determined pulse sequences, and the gain quantization unit 118 obtains quantized fixed-codebook gains on the basis of the obtained fixed-codebook gains, in that order, and the determination in step S111 cannot be made in each frame or in each subframe on the basis of the fixed-codebook gain in the frame or subframe or a code corresponding to the fixed-codebook gain.

For example, a quantized pitch gain and a quantized fixed-codebook gain in a preceding subframe before the current subframe (the immediately preceding subframe, for example)

may be supplied from the gain quantization unit 118; the signals may be determined to be stationary (periodic) or non-stationary (non-periodic) by using the quantized fixed-codebook gain or its corresponding value and the quantized pitch gain or its corresponding value as indices, and it may be selected according to the result of the determination whether to perform the first fixed-codebook search and the first encoding or the second fixed-codebook search and the second encoding in the current subframe. Further, a fixed number of bits may be assigned to a code index $C_{fl}$ in a first subframe located at the beginning of a frame; and in the first subframe, the determination in step S111 may not be made, and fixed-codebook search and encoding may be applied only to pulse sequences that can be expressed with the code index $C_{fl}$ having the fixed number of bits.

The signals may also be determined to be stationary (periodic) or non-stationary (non-periodic) by using a quantized fixed-codebook gain or its corresponding value and a quantized pitch gain or its corresponding value in a single subframe (a first subframe, for example) included in the current frame or a preceding frame (the immediately preceding frame, for example) as indices, and it may be selected according to the result of the determination whether to perform the first fixed-codebook search and the first encoding or the second fixed-codebook search and the second encoding in the current frame.

Alternatively, if all the determinations made in the subframes included in a preceding frame by using a combination of a quantized fixed-codebook gain or its corresponding value and a quantized pitch gain or its corresponding value in each subframe indicate that the signals are stationary (periodic), the first fixed-codebook search and the first encoding may be selected in the current frame; otherwise, the second fixed-codebook search and the second encoding may be selected in the current frame. Alternatively, if the determinations made in a specified number of subframes or more included in a preceding frame indicate that the signals are stationary (periodic), the first fixed-codebook search and the first encoding may be selected in the current frame; otherwise, the second fixed-codebook search and the second encoding may be selected in the current frame.

Alternatively, if all the determinations made in the subframes included in a preceding frame by using a combination of a quantized fixed-codebook gain or its corresponding value and a quantized pitch gain or its corresponding value in each subframe indicate that the signals are non-stationary (non-periodic), the second fixed-codebook search and the second encoding may be selected in the current frame; otherwise, the first fixed-codebook search and the first encoding may be selected in the current frame. Alternatively, if the determinations made in a specified number of subframes or more included in a preceding frame indicate that the signals are non-stationary (non-periodic), the second fixed-codebook search and the second encoding may be selected in the current frame; otherwise, the first fixed-codebook search and the first encoding may be selected in the current frame.

The signals may also be determined to be stationary (periodic) or non-stationary (non-periodic) by using a combination of a quantized fixed-codebook gain or its corresponding value and a quantized pitch gain or its corresponding value in a first subframe included in the current frame, and it may be selected according to the result of the determination whether to perform the first fixed-codebook search and the first encoding or the second fixed-codebook search and the second encoding in all the subframes other than the first subframe in the current frame. In that case, a fixed number of bits may be assigned to a code index $C_{fl}$ in the first subframe. Alternatively, it may be selected whether to perform the first fixed-codebook search and the first encoding or the second fixed-codebook search and the second encoding in the first subframe by using a combination of a quantized fixed-codebook gain or its corresponding value and a quantized pitch gain or its corresponding value in a preceding frame or a subframe included in that frame as an index.

[Specific Case 5 of Step S111]

Specific case 5 of step S111 uses a quantized pitch gain or its corresponding value and a value corresponding to a quantized fixed-codebook gain as indices that indicate a level of stationarity (periodicity) of time series signals. In this case, the quantized pitch gain or its corresponding value and the value corresponding to the quantized fixed-codebook gain are compared with a first specified value and a second specified value, respectively.

Generally, pitch periods are highly periodic, and pitch gains are large in stationary frames. Although pitch periods have high periodicity in a frame located at the rising edge of speech, pitch periods have low periodicity and pitch gains are small in the immediately preceding frame. In the frame located at the rising edge of speech, an estimated value $pg_{cj}$ of the fixed-codebook gain in the current frame, predicted by using the preceding frame, becomes small. Since the quantized fixed-codebook gain $g_c'$ in the current frame is determined as given by $g_c' = \gamma_{gc}\hat{} \times pg_{cj}$ ($\gamma_{gc}\hat{}$ is a quantized correction factor), $\gamma\hat{}_{gc}$ (value corresponding to the quantized fixed-codebook gain) becomes a large value in the frame located at the rising edge of speech. Therefore, even if the quantized pitch gain or its corresponding value is small, if the value corresponding to the quantized fixed-codebook gain is large, the frame can be considered as being stationary. On the contrary, if the quantized pitch gain or its corresponding value is small and if the value corresponding to the quantized fixed-codebook gain is small, the frame can be considered as not being stationary.

Examples of determination criteria using the indices will be given below.

Determination criterion 1: When a quantized pitch gain or its corresponding value is smaller than a first specified value and when a value corresponding to a quantized fixed-codebook gain is larger than a second specified value, the time series signals are determined to be stationary (periodic).

Determination criterion 2: When the quantized pitch gain or its corresponding value is smaller than the first specified value and when the value corresponding to the quantized fixed-codebook gain is smaller than the second specified value, the time series signals are determined to be non-stationary (non-periodic).

Examples of the value corresponding to the quantized pitch gain include the average of quantized pitch gains and a value of a non-decreasing function (weakly monotonically increasing function) of quantized pitch gains. An example of the quantized pitch gain is $g\hat{}_p$ (quantified adaptive codebook gain) in Non-Patent Literature 1. Examples of the value corresponding to the quantized fixed-codebook gain include a quantized fixed-codebook gain and a quantized correction factor $\gamma_{gc}\hat{}$. An example of the quantized correction factor $\gamma_{gc}\hat{}$ is $\gamma_{gc}\hat{}$ (optimum value for $\gamma_{gc}$) in Non-Patent Literature 1.

Information (a quantized excitation gain code such as a quantized fixed-codebook gain and a quantized pitch gain, or a VQ gain code, for example) for obtaining a value corresponding to a quantized fixed-codebook gain and a quantized pitch gain or its corresponding value is input to the switch 115c in this case. If the value corresponding to the quantized fixed-codebook gain and the quantized pitch gain or its corresponding value obtained from the input information satisfy the determination criterion 1, the switch 115c determines that the signals are stationary (periodic); if the condition is not satisfied, the switch 115c determines that the signals are non-stationary (non-periodic). Alternatively, if the value corresponding to the quantized fixed-codebook gain and the quantized pitch gain or its corresponding value obtained from the input information satisfy the determination criterion 2, the switch 115c determines that the signals are non-stationary (non-periodic); if the condition is not satisfied, the switch 115c determines that the signals are stationary (periodic).

Step S111 in this case may be executed in each frame or may be executed in each subframe. Pitch analysis, fixed-codebook search, quantization, and encoding for obtaining an index in this case may also be executed in each frame or may be executed in each subframe. As in specific case 4 of step S111, the time interval corresponding to the index in this case is before the time interval in which fixed-codebook search and encoding is performed in accordance with the result of determination made by using the index. The reason is the same as described in specific case 4 of step S111. A different condition may be added to the determination criterion 1 or 2.

[Specific Case 6 of Step S111]

In specific case 6 of step S111, a combination of a pitch gain and a fixed-codebook gain is vector-quantized in step S111, and a VQ gain code is associated with a combination of a quantized pitch gain and a quantized fixed-codebook gain. This case uses the VQ gain code as an index that indicates a level of stationarity (periodicity) of time series signals. For example, determinations in specific case 3, 4, or 5 of step S111 are made by using the VQ gain code as an index. Examples of determination techniques using the VQ gain code as an index will be described below.

As described earlier, one VQ gain code corresponds to one combination of a quantized pitch gain and a quantized fixed-codebook gain or one combination of a quantized pitch gain and a quantized value of a value corresponding to a fixed-codebook gain. Therefore, the results of determinations in specific case 3, 4, or 5 of step S111 can be associated with respective VQ gain codes. Specifically, since a determination in specific case 3 of step S111 is made by using a quantized pitch gain or its corresponding value as an index, the result of the determination can be associated with the VQ gain code corresponding to the quantized pitch gain corresponding to the index (a value corresponding to the quantized pitch gain). Since a determination in specific case 4 of step S111 is made by using the ratio between a quantized pitch gain or its corresponding value and a quantified fixed-codebook gain or its corresponding value as an index, the VQ gain code corresponding to the ratio used as the index can be associated with the result of the determination. Since a determination in specific case 5 of step S111 is made by using a quantized pitch gain or its corresponding value and a quantized fixed-codebook gain or its corresponding value as indices, the VQ gain code corresponding to the quantized pitch gain and quantized fixed-codebook gain corresponding to the indices can be associated with the result of the determination. Therefore, whether the signals are stationary (periodic) or non-stationary (non-periodic) can be determined beforehand in specific case 3, 4, or 5 of step S111, and a table in which such a determination is associated with a VQ gain code corresponding to the determination result can be stored in the switch 115c. The switch 115c can obtain the result of determination corresponding to an input VQ gain code with reference to such a table. Alternatively, since such a determination result determines whether to perform the first fixed-codebook search and the first encoding or the second fixed-codebook search and the second encoding, a table in which each VQ gain code is associated with information indicating whether to perform the first fixed-codebook search and the first encoding or the second fixed-codebook search and the second encoding can be stored in the switch 115c. In that case, the switch 115c can obtain the mode for fixed-codebook search and encoding (the first fixed-codebook search and the first encoding or the second fixed-codebook search and the second encoding) corresponding to an input VQ gain code with reference to such a table.

[Specific Case 7 of Step S111]

Specific case 7 of step S111 uses the magnitude of the difference between a value corresponding to the pitch period of the time series signals in a first time interval and a value corresponding to the pitch period of the time series signals in a second time interval which is in a predetermined positional relationship with the first time interval, or its corresponding value, as an index that indicates a level of stationarity (periodicity) of the time series signals. The first time interval may follow the second time interval, and the first time interval may precede the second time interval. The first time interval and second time interval may be adjacent time intervals or may not be adjacent time intervals. Alternatively, the first time interval and the second time interval may partially overlap. Examples of the value corresponding to the pitch period include a pitch period and an integer part of the pitch period. An example of the value corresponding to the magnitude of the difference is a value of a non-decreasing function (weakly monotonically increasing function) with respect to the magnitude of the difference.

Information (pitch periods, the integer parts of pitch periods, the difference between pitch periods, the difference between the integer parts of pitch periods, for example) for obtaining the magnitude of the difference between a value corresponding to the pitch period of the time series signals in a first time interval and a value corresponding to the pitch period of the time series signals in a second time interval which follows the first time interval, or its corresponding value is input to the switch 115c in this case. If the condition that the magnitude of the difference obtained from the input information or its corresponding value is smaller than a specified value (a condition that indicates high periodicity and/or high stationarity) is satisfied, the switch 115c determines that the signals are stationary (periodic); if the condition is not satisfied, the switch 115c determines that the signals are non-stationary (non-periodic). Alternatively, if the condition that the magnitude of the difference or its corresponding value is larger than the specified value (a condition that indicates low periodicity and/or low stationarity) is not satisfied, the switch 115c determines that the signals are stationary (periodic); if the condition is satisfied, the switch 115c determines that the signals are non-stationary (non-periodic). The basis of the determinations is that time series signals such as speech signals have small variations in pitch period in a time period in which the signals are stationary (periodic) and large variations in pitch period in a time period in which the signals are non-stationary (non-periodic).

Step S111 in this case may be executed in each frame or may be executed in each subframe. The first time interval and the second time interval may be a frame or a subframe. The first time interval and the second time interval corresponding to an index in this case may coincide with, may overlap, or may not overlap a time interval in which fixed-codebook search and encoding are performed in accordance with the result of determination made by using the index.

For example, whether the signals are stationary (periodic) or non-stationary (non-periodic) may be determined by using the magnitude of the difference between the integer part of a pitch period in a preceding subframe before the current target subframe of fixed-codebook search (the immediately preceding subframe, for example) and the integer part of a pitch period in the current subframe as an index, and it may be selected according to the result of the determination whether to perform the first fixed-codebook search and the first encoding or the second fixed-codebook search and the second encoding in the current subframe. Alternatively, whether the signals are stationary (periodic) or non-stationary (non-periodic) may be determined by using the magnitude of the difference TD (1, 2) between the integer parts of the pitch periods $T_1$ and $T_2$ in first and second subframes included in a preceding frame before the current frame (the immediately preceding frame, for example) as an index, and it may be selected according to the result of the determination whether to perform the first fixed-codebook search and the first encoding or the second fixed-codebook search and the second encoding in the current frame.

Alternatively, the magnitude of the difference TD(1, 2) between the integer parts of the pitch periods $T_1$ and $T_2$ in first and second subframes included in a preceding frame before the current frame (the immediately preceding frame, for example) and the magnitude of the difference TD(3,4) between the integer parts of the pitch periods $T_3$ and $T_4$ in the third and fourth subframes may be used as indices, and if they are both smaller than a specified value, the signals may be determined to be stationary (periodic), and the first fixed-codebook search and the first encoding may be performed in the current frame; otherwise, the signals may be determined to be non-stationary (non-periodic), and the second fixed-codebook search and the second encoding may be performed in the current frame. Alternatively, if both the difference TD(1, 2) and the difference TD(3, 4) are larger than the specified value, the signals may be determined to be non-stationary (non-periodic), and the second fixed-codebook search and the second encoding may be performed in the current frame; otherwise, the signals may be determined to be stationary (periodic), and the first fixed-codebook search and the first encoding may be performed in the current frame.

Alternatively, if the difference TD(1, 2) is smaller than specified value A and if the difference TD(3, 4) is smaller than specified value B, the signals may be determined to be stationary (periodic), and the first fixed-codebook search and the first encoding may be performed in the current frame; otherwise, the signals may be determined to be non-stationary (non-periodic), and the second fixed-codebook search and the second encoding may be performed in the current frame. Alternatively, if the difference TD(1, 2) is larger than specified value A and if the difference TD(3, 4) is larger than specified value B, the signals may be determined to be non-stationary (non-periodic), and the second fixed-codebook search and the second encoding may be performed in the current frame; otherwise, the signals may be determined to be stationary (periodic), and the first fixed-codebook search and the first encoding may be performed in the current frame.

[Specific Case 8 of Step S111]

Whether the signals are stationary (periodic) or non-stationary (non-periodic) may be determined according to whether a combination of at least some conditions described in specific cases 1 to 7 of step 111 is satisfied. Whether the signals are stationary (periodic) or non-stationary (non-periodic) may also be determined according to whether the conditions described in specific cases 1 to 7 of step 111 and some additional conditions are satisfied.

[Specific Case 1 of Steps S112 and S113]

Examples of the first fixed-code search and the first encoding (step S112), which are performed when the time series signals are determined to be stationary (periodic), and the second fixed-code search and the second encoding (step S113), which are performed when the time series signals are determined to be non-stationary (non-periodic), will be described next. Examples of fixed-codebook search and encoding in each subframe having 64 sample points will be described next. These examples will not confine the present invention.

In the second fixed-codebook search and the second encoding (with a large number of encoding bits) in this case, the second search unit 115b searches through the positions specified in the fixed codebook 113, as listed in Table 1, obtains a pulse sequence composed of four signals having values of combinations of positions and polarities of unit pulses and sixty signals having zero values, and outputs a corresponding code (code index) (step S113).

TABLE 1

| Track | Pulse | Positions |
|---|---|---|
| 1 | $i_0$ | 0, 4, 8, 12, 16, 20, 24, 28, 32, 36, 40, 44, 48, 52, 56, 60 |
| 2 | $i_1$ | 1, 5, 9, 13, 17, 21, 25, 29, 33, 37, 41, 45, 49, 53, 57, 61 |
| 3 | $i_2$ | 2, 6, 10, 14, 18, 22, 26, 30, 34, 38, 42, 46, 50, 54, 58, 62 |
| 4 | $i_3$ | 3, 7, 11, 15, 19, 23, 27, 31, 35, 39, 43, 47, 51, 55, 59, 63 |

In this case, four tracks each having sixteen positions (sample points) of unit pulses are specified for a single subframe. The second search unit 115b specifies a pulse sequence corresponding to a subframe by selecting the position and polarity of one unit pulse in each track. The signal values at sample points in the subframe, other than the positions of selected unit pulses, are zero. Information needed to express the pulse sequence includes four bits for expressing the position of one pulse and one bit for expressing the polarity of the pulse in each track. Each track requires five bits, and 20 bits in total for four tracks express a pulse sequence of a subframe. In other words, a code index of a pulse sequence for a single subframe has 20 bits.

In the first fixed-codebook search and the first encoding (with a small number of encoding bits) in this case, a pulse sequence is obtained by performing a search in a range that can be expressed with a smaller number of bits than the number of bits expressing a pulse sequence that is obtained from Table 1 by the first search unit 115a, and a corresponding code index is output (step S112).

For example, the first search unit 115a searches through positions specified in the fixed codebook 113, as listed in Table 2, obtains a pulse sequence composed of three signals having values of combinations of pulse positions and pulse polarities and 61 signals having zero values, and outputs a corresponding code index.

TABLE 2

| Track | Pulse | Positions |
|---|---|---|
| 1 | $i_0$ | 0, 4, 8, 12, 16, 20, 24, 28, 32, 36, 40, 44, 48, 52, 56, 60 |
| 2 | $i_1$ | 1, 5, 9, 13, 17, 21, 25, 29, 33, 37, 41, 45, 49, 53, 57, 61 |
| 3 | $i_2$ | 2, 6, 10, 14, 18, 22, 26, 30, 34, 38, 42, 46, 50, 54, 58, 62 |

In this case, three tracks each having 16 positions of unit pulses are specified for a single subframe. The first search unit 115a specifies a pulse sequence corresponding to a subframe by selecting the position and polarity of one unit pulse in each track. The signal values at sample points in the subframe, other than the positions of the selected unit pulses, are zero. In that case, a code index of a pulse sequence of a single subframe has 15 bits. Here, although track 4 is excluded from the positions of unit pulses, any other track may be excluded from the positions of unit pulses.

Alternatively, the first search unit 115a may obtain a pulse sequence composed of three signals having values of combinations of positions and polarities of unit pulses and 61 signals having zero values by selecting three tracks dynamically from those listed in Table 1 specified in the fixed codebook 113, and may output a corresponding code index (step S112). In that case, two extra bits will be needed to express one track that is not selected from the four tracks. Therefore, a code index of a pulse sequence for a single subframe has 17 bits.

The positions of unit pulses in a track may be reduced from those indicated in Table 1. For example, as shown in Table 3, the positions of unit pulses in track 4 may be fixedly restricted to a half (eight) of those in Table 1.

TABLE 3

| Track | Pulse | Positions |
|---|---|---|
| 1 | $i_0$ | 0, 4, 8, 12, 16, 20, 24, 28, 32, 36, 40, 44, 48, 52, 56, 60 |
| 2 | $i_1$ | 1, 5, 9, 13, 17, 21, 25, 29, 33, 37, 41, 45, 49, 53, 57, 61 |
| 3 | $i_2$ | 2, 6, 10, 14, 18, 22, 26, 30, 34, 38, 42, 46, 50, 54, 58, 62 |
| 4 | $i_3$ | 35, 39, 43, 47, 51, 55, 59, 63 |

In the example shown, one subframe has three tracks (tracks 1 to 3) each having 16 positions of unit pulses and one track (track 4) having eight positions of unit pulses. The code index of a pulse sequence of a single subframe has 19 bits in the example shown.

Alternatively, the positions of unit pulses in a plurality of tracks may be fixedly reduced from those in Table 1. For example, as shown in Table 4, if the positions of unit pulses in two of the four tracks in Table 1 are halved (eight), the number of bits of a code index of a pulse sequence of a single subframe becomes 18 bits.

TABLE 4

| Track | Pulse | Positions |
|---|---|---|
| 1 | $i_0$ | 0, 4, 8, 12, 16, 20, 24, 28 |
| 2 | $i_1$ | 1, 5, 9, 13, 17, 21, 25, 29, 33, 37, 41, 45, 49, 53, 57, 61 |
| 3 | $i_2$ | 2, 6, 10, 14, 18, 22, 26, 30, 34, 38, 42, 46, 50, 54, 58, 62 |
| 4 | $i_3$ | 35, 39, 43, 47, 51, 55, 59, 63 |

Alternatively, for example, if the positions of unit pulses in all the four tracks in Table 1 are halved, the number of bits of a code index of a pulse sequence of a single subframe becomes 16 bits.

Alternatively, the first search unit 115a may obtain a pulse sequence composed of two signals having values of combinations of pulse positions and pulse polarities and 62 signals having zero values by searching through the positions listed in Table 5 and may output a corresponding code index.

TABLE 5

| Track | Pulse | Positions |
|---|---|---|
| 1 | $i_0$ | 0, 2, 4, 6, 8, 10, 12, 14, 16, 18, 20, 22, 24, 26, 28, 30, 32, 34, 36, 38, 40, 42, 44, 46, 48, 50, 52, 54, 56, 58, 60, 62 |
| 2 | $i_1$ | 1, 3, 5, 7, 9, 11, 13, 15, 17, 19, 21, 23, 25, 27, 29, 31, 33, 35, 37, 39, 41, 43, 45, 47, 49, 51, 53, 55, 57, 59, 61, 63 |

Information needed to express the pulse sequence in this case includes five bits for expressing the position of one pulse and one bit for expressing the polarity of the pulse in each track. Therefore, each track requires six bits, and 12 bits in total for two tracks express a pulse sequence of a subframe. A code index of a pulse sequence for a single subframe has 12 bits.

The method of limiting the positions of unit pulses is not limited. The positions of unit pulses in a first half or a second half of a track may be excluded, or alternate positions of unit pulses may be excluded. The polarities of pulses may also be fixed to positive or negative. For example, if the polarities of unit pulses are fixed when the positions listed in Table 1 are searched through, the number of bits of a code index of a pulse sequence for a single subframe becomes 16 bits.

[Specific Case 2 of Steps S112 and S113]

In the first fixed-codebook search and the first encoding (with a small number of encoding bits) in this case, the first search unit 115a obtains a pulse sequence composed of four signals having values of combinations of positions and polarities of unit pulses and 60 signals having zero values by searching through the positions listed in Table 1 specified in the fixed codebook 113 and outputs a corresponding code (step S112). In this case, a code index of the pulse sequence for a single subframe has 20 bits.

In the second fixed-codebook search and the second encoding (with a large number of encoding bits) in this case, the second search unit 115b obtains a pulse sequence by searching through a range that can be expressed by a larger number of bits than the number of bits expressing a pulse sequence that is obtained from Table 1 and outputs a corresponding code index (step S113).

For example, the second search unit 115b specifies a pulse sequence corresponding to a subframe by selecting the positions and polarities of two unit pulses for a predetermined track (track 1, for example) listed in Table 1 and selecting, for the other tracks, the position and polarity of a single unit pulse for each track. Signal values at sample points in the subframe other than the positions of the selected unit pulses are zero. A code index of a pulse sequence corresponding to a single subframe has 25 bits in this example.

Alternatively, the second search unit 115b may select the position of a single unit pulse for a predetermined track (track 1, for example) indicated in Table 1, and whereby the selected unit pulse and another unit pulse located a fixed number of sample points (four sample points, for example) after the selected unit pulse may be specified. The second search unit 115b further selects the polarities of these two unit pulses and selects, for the other tracks, the position and polarity of a single unit pulse for each track, to specify a pulse sequence corresponding to the subframe. A code index of a pulse sequence for the single subframe has 21 bits in this example.

Alternatively, the second search unit 115b may select the position of a single unit pulse for a predetermined track (track 1, for example) listed in Table 1 and may select whether the position of another unit pulse is at a fixed number of sample points (four sample points, for example) before or after the selected unit pulse, to specify the first unit pulse and another unit pulse a fixed number of sample points before or after the first unit pulse. The second search unit 115b further selects the polarities of these two unit pulses and selects, for the other tracks, the position and polarity of a single unit pulse for each track, to specify a pulse sequence corresponding to the subframe. Here, one extra bit is added to express whether the second unit pulse is specified at a fixed number of sample points before or after the first unit pulse, and a code index of the pulse sequence corresponding to a single subframe has 22 bits.

[Decoding Method]

A bit stream BS (code) output from the parameter encoding unit 119 in the encoder 11 (FIG. 1) is input as an input code to the parameter decoding unit 129 in the decoder 12 (FIG. 2). The parameter decoding unit 129 decodes the bit stream BS and outputs linear prediction information LPC info, pitch periods $T_1'$, $T_2'$, $T_3'$, and $T_4'$, code indices $C_{f1}$, $C_{f2}$, $C_{f3}$, and $C_{f4}$, and quantized pitch gains $g_{p1}\hat{}$, $g_{p2}\hat{}$, $g_{p3}\hat{}$, and $g_{p4}\hat{}$ and quantized fixed-codebook gains $g_{c1}\hat{}$, $g_{c2}\hat{}$, $g_{c3}\hat{}$, and $g_{c4}\hat{}$ corresponding to quantized excitation gain codes $GA_{f1}$, $GA_{f2}$, $GA_{f3}$, and $GA_{f4}$.

The fixed codebook 123 decodes the input code indices $C_{f1}$, $C_{f2}$, $C_{f3}$, and $C_{f4}$ under the control of the fixed codebook selection unit 125 and outputs pulse sequences $c_{f1}$, $c_{f2}$, $c_{f3}$, and $c_{f4}$ corresponding to the frame. The adaptive codebook 122 outputs adaptive signal components v'(n) (n=0 to L−1) specified by the input pitch periods $T_1'$, $T_2'$, $T_3'$, and $T_4'$.

The following excitation signals u'(n) (n=0 to L−1) obtained by adding the pulse sequences $c_{f1}$, $c_{f2}$, $c_{f3}$, and $c_{f4}$ multiplied by the quantized fixed-codebook gains $g_{c1}\hat{}$, $g_{c2}\hat{}$, $g_{c3}\hat{}$, and $g_{c4}\hat{}$ and the adaptive signal components v'(n) (n=0 to L−1) multiplied by the quantized pitch gains $g_{p1}\hat{}$, $g_{p2}\hat{}$, $g_{p3}\hat{}$, and $g_{p4}\hat{}$ are added to the adaptive codebook 122.

$$u'(n)=g_{p1}\hat{}\cdot v'(n)+g_{c1}\hat{}\cdot c_{f1}(n)(n=0 \text{ to } L_{f1}-1)$$

$$u'(n)=g_{p2}\hat{}\cdot v'(n)+g_{c2}\hat{}\cdot c_{f2}(n)(n=L_{f1} \text{ to } L_{f1}-1)$$

$$u'(n)=g_{p3}\hat{}\cdot v'(n)+g_{c3}\hat{}\cdot c_{f3}(n)(n=L_{f2} \text{ to } L_{f3}-1)$$

$$u'(n)=g_{p4}\hat{}\cdot v'(n)+g_{c4}\hat{}\cdot c_{f4}(n)(n=L_{f3} \text{ to } L-1)$$

The all-pole synthesis filter 127 specified by the linear prediction information LPC info is applied to the excitation signals u'(n) (n=0 to L−1), and generated synthesized signals x'(n) (n=0 to L−1) are output.

[Method of Decoding Code Index]

A mode for decoding code indices $C_{f1}$, $C_{f2}$, $C_{f3}$, and $C_{f4}$, which is a characteristic feature of this embodiment, will be described next.

As shown in FIG. 4B, in the decoding of code indices $C_{f1}$, $C_{f2}$, $C_{f3}$, and $C_{f4}$, in this embodiment, the switch 125c selects the mode for encoding code indices $C_{f1}$, $C_{f2}$, $C_{f3}$, and $C_{f4}$ (codes corresponding to pulse sequences) included in a bit stream BS corresponding to a frame (predetermined time interval), depending on whether an index that indicates a level of periodicity and/or stationarity obtained from the input bit stream BS (code) satisfies a condition that indicates high periodicity and/or high stationarity or a condition that indicates low periodicity and/or low stationarity (step S121). The first selection unit 125a, the second selection unit 125b, and the fixed codebook 123 decode the code indices $C_{f1}$, $C_{f2}$, $C_{f3}$, and $C_{f4}$ and obtain pulse sequences $c_{f1}$, $c_{f2}$, $c_{f3}$, and $c_{f4}$ corresponding to the current frame (steps S122, S123).

The index that indicates the level of periodicity and/or stationarity obtained from the input bit stream BS (code) in the decoder 12 corresponds to the index that indicates the level of periodicity and/or stationarity of the time series signals input to the encoder 11.

If the switch 125c determines that the signals are stationary (periodic), the first selection unit 125a decodes the input code index in a decoding mode for decoding a code index having a small number R1 of bits and obtains a pulse sequence (step S122). If the switch 125c determines that the signals are non-stationary (non-periodic), the second selection unit 125b decodes the input code index in a decoding mode for decoding a code index having a large number R2 (R2>R1) of bits and obtains a pulse sequence (step S123).

In other words, when the index that indicates the level of periodicity and/or stationarity satisfies the condition that indicates high periodicity and/or high stationarity, the fixed codebook 123 decodes the code index (code) having a first number R1 of bits, corresponding to a pulse sequence (step S122), and when the index that indicates the level of periodicity and/or stationarity does not satisfy the condition that indicates high periodicity and/or high stationarity, the fixed codebook 123 decodes the code having a second number R2 of bits, corresponding to a pulse sequence (step S123). Alternatively, when the index that indicates the level of periodicity and/or stationarity satisfies the condition that indicates low periodicity and/or low stationarity, the fixed codebook 123 decodes the code having the second number R2 of bits, corresponding to a pulse sequence (step S123), and when the index that indicates the level of periodicity and/or stationarity does not satisfy the condition that indicates high periodicity and/or high stationarity, the fixed codebook 123 decodes the code having the first number R1 of bits, corresponding to a pulse sequence (step S122).

The process of steps S121 to S123 correspond to the process of steps S111 to S113 described earlier. Whether the signals are stationary (periodic) or non-stationary (non-periodic) is determined in step S121 based on the same criterion as in step S111, and decoding in step S122 or S123 is performed in the decoding mode corresponding to step S112 or S113.

[Specific Case 1 of Step S121]

Specific case 1 of step S121 corresponds to a decoding mode after the process described earlier in specific case 1 of step S111 has been performed. This case uses an estimated value of a prediction gain, which corresponds to the ratio of the magnitudes of the time series signals to the magnitudes of the prediction residuals obtained by linear prediction analysis of the time series signals input to the encoder 11. Here, information for obtaining the index (linear prediction information LPC info obtained by the parameter decoding unit 129, for example) is input to the switch 125c. The switch 125c determines that the signals are stationary (periodic) when the condition that the estimated value of the prediction gain is larger than a specified value (a condition that indicates that indicates high periodicity and/or high stationarity) is satisfied and determines that the signals are non-stationary (non-periodic) when the condition is not satisfied. Alternatively, the switch 125c in this case determines that the signals are stationary (periodic) when the condition that the estimated value of the prediction gain is smaller than the specified value (a condition that indicates that indicates low periodicity and/or low stationarity) is not satisfied and determines that the signals are non-stationary (non-periodic) when the condition is satisfied.

[Specific Case 2 of Step S121]

Specific case 2 of step S121 corresponds to a decoding mode after the process described earlier in specific case 2 of step S111 has been performed. A quantized PARCOR coefficient or its corresponding value is used in this case as an index that indicates a level of periodicity and/or stationarity. Information (linear prediction information LPC info obtained by the parameter decoding unit 129, for example) for obtaining the magnitude of the quantized PARCOR coefficient or its corresponding value is input in this case to the switch 125c. The switch 125c determines that the signals are stationary (periodic) when the condition that the magnitude of the quantized PARCOR coefficient obtained from the input information or its corresponding value is larger than a specified value (a condition that indicates high periodicity and/or high stationarity) is satisfied and determines that the signals are non-stationary (non-periodic) when the condition is not satisfied. Alternatively, the switch 125c determines that the signals are stationary (periodic) when the condition that the magnitude of the quantized PARCOR coefficient or its corresponding value is smaller than the specified value (a condition that indicates low periodicity and/or low stationarity) is not satisfied and determines that the signals are non-stationary (non-periodic) when the condition is satisfied.

[Specific Case 3 of Step S121]

Specific case 3 of step S121 corresponds to a decoding mode after the process described earlier in specific case 3 of step S111 has been performed. A quantized pitch gain or its corresponding value is used in this case as an index that indicates a level of periodicity and/or stationarity. Information for obtaining the quantized pitch gain or its corresponding value (the quantized pitch gain obtained in the parameter decoding unit 129, or a quantized excitation gain code such as a VQ gain code included in the bit stream BS (codes) input to the decoder 12, for example) is input in this case to the switch 125c. The switch 125c determines that the signals are stationary (periodic) when the condition that the quantized pitch gain or its corresponding value obtained from the input information is larger than a specified value (a condition that indicates high periodicity and/or high stationarity) is satisfied and determines that the signals are non-stationary (non-periodic) when the condition is not satisfied. Alternatively, the switch 125c determines that the signals are stationary (periodic) when the condition that the quantized pitch gain or its corresponding value is smaller than the specified value (a condition that indicates high periodicity and/or high stationarity) is not satisfied and determines that the signals are non-stationary (non-periodic) when the condition is satisfied.

[Specific Case 4 of Step S121]

Specific case 4 of step S121 corresponds to a decoding mode after the process described earlier in specific case 4 of step S111 has been performed. A quantized pitch gain or its corresponding value and a quantized fixed-codebook gain or its corresponding value are used as indices that indicate a level of stationarity (periodicity). Information for obtaining the quantized pitch gain or its corresponding value and the quantized fixed-codebook gain or its corresponding value (the quantized fixed-codebook gain obtained in the parameter decoding unit 129, the quantized pitch gain obtained in the parameter decoding unit 129, or a quantized excitation gain code such as a VQ gain code included in the input bit stream BS (codes) input to the decoder 12, for example) is input in this case to the switch 125c. The switch 125c determines that the signals are stationary (periodic) when the condition that indicates that the ratio of the quantized pitch gain or its corresponding value to the quantized fixed-codebook gain or its corresponding value obtained from the input information is larger than a specified value (a condition that indicates high periodicity and/or high stationarity) is satisfied and determines that the signals are non-stationary (non-periodic) when the condition is not satisfied. Alternatively, the switch 125c determines that the signals are stationary (periodic) when the condition that indicates that the ratio of the quantized pitch gain or its corresponding value to the quantized fixed-codebook gain or its corresponding value is smaller than the specified value (a condition that indicates low periodicity and/or low stationarity) is not satisfied and determines that the signals are non-stationary (non-periodic) when the condition is satisfied.

[Specific Case 5 of Step S121]

Specific case 5 of step S121 corresponds to a decoding mode after the process described earlier in specific case 5 of step S111 has been performed. A quantized pitch gain or its corresponding value and a value corresponding to a quantized fixed-codebook gain are used in this case as indices that indicate a level of stationarity (periodicity). The quantized pitch gain or its corresponding value and the value corresponding to the quantized fixed-codebook gain are compared with a first specified value and a second specified value, respectively. Information (the quantized fixed-codebook gain obtained in the parameter decoding unit 129, the quantized pitch gain obtained in the parameter decoding unit 129, or a quantized excitation gain codes such as a VQ gain code included in the bit stream BS (codes) input to the decoder 12, for example) for obtaining the quantized fixed-codebook gain or its corresponding value and the value corresponding to the quantized pitch gain is input in this case to the switch 125c. The switch 125c determines that the signals are non-stationary (non-periodic) when the quantized fixed-codebook gain or its corresponding value and the quantized pitch gain or its corresponding value, obtained from the input information, satisfy the determination criterion 2 described earlier and determines that the signals are stationary (periodic) when the condition is not satisfied. Alternatively, the switch 125c determines that the signals are stationary (periodic) when the quantized fixed-codebook gain or its corresponding value and the quantized pitch gain or its corresponding value, obtained from the input information, satisfy the determination criterion 1 described earlier and determines that the signals are non-stationary (non-periodic) when the condition is not satisfied.

[Specific Case 6 of Step S121]

Specific case 6 of step S121 corresponds to a decoding mode after the process described earlier in specific case 6 of step S111 has been performed. A VQ gain code included in the bit stream BS (codes) input to the decoder 12 is used in this case as an index that indicates a level of stationarity (periodicity). Whether the signals are stationary (periodic) or non-stationary (non-periodic) is determined beforehand in accordance with any of specific cases 3 to 5 of step S121, and a table associating the results of determination with corresponding VQ gain codes is stored in the switch 125c. The switch 125c obtains the result of determination corresponding to an input VQ gain code with reference to the table. Alternatively, a table in which VQ gain codes are associated with decoding modes can be stored in the switch 125c. In that case, the switch 125c can obtain a decoding mode corresponding to an input VQ gain code with reference to the table.

[Specific Case 7 of Step S121]

Specific case 7 of step S121 corresponds to a decoding mode after the process described earlier in specific case 7 of step S111 has been performed. The magnitude of difference between a value corresponding to a pitch period in a first time interval and a value corresponding to a pitch period in a second time interval which is after the first time interval, or its corresponding value is used in this case as an index that indicates a level of stationarity (periodicity). Information (the pitch periods obtained in the parameter decoding unit 129, the integer parts of the pitch periods, the difference between the pitch periods, the difference between the integer parts of pitch periods, for example) for obtaining the magnitude of the difference between the value corresponding to the pitch period in the first time interval and the value corresponding to the pitch period in the second time interval, which is after the first time interval, or its corresponding value is input to the switch 125c in this case. The switch 125c determines that the signals are stationary (periodic) when the condition that the magnitude of the difference obtained from the input information or its corresponding value is smaller than a specified value (a condition that indicates high periodicity and/or high stationarity) is satisfied and determines that the signals are non-stationary (non-periodic) when the condition is not satisfied. Alternatively, the switch 125c determines that the signals are stationary (periodic) when the condition that the magnitude of the difference or its corresponding value is larger than the specified value (a condition that indicates low periodicity and/or low stationarity) is not satisfied and determines that the signals are non-stationary (non-periodic) when the condition is satisfied.

[Specific Case 8 of Step S121]

Specific case 8 of step S121 corresponds to a decoding mode after the process described earlier in specific case 8 of step S111 has been performed. Whether the signals are stationary (periodic) or non-stationary (non-periodic) is determined according to whether a combination of at least some of the conditions described in specific cases 1 to 7 of step S121 is satisfied or whether those conditions plus another condition are satisfied.

Second Embodiment

A second embodiment of the present invention will now be described. This embodiment is a modification of the first embodiment. In this embodiment, a pitch period encoding mode and decoding mode are selected in accordance with the determination result of whether the signals are stationary (periodic) or non-stationary (non-periodic). The contribution of the periodic components of time series signals to the entire codes is small in a time interval in which the signals are non-stationary (non-periodic). Therefore, even if resolution for expressing pitch periods or the encoding frequency (the frequency of frames where encoding is performed) are lowered, the encoding quality is not lowered much. In the second embodiment, resolution for expressing pitch periods or the encoding frequency used when the signals are determined to be non-stationary (non-periodic) are made lower than resolution for expressing pitch periods or the encoding frequency used when the signals are determined to be stationary (periodic).

Mainly, differences from the first embodiment will be described below. Items that are identical to those in the first embodiment will be denoted by the same reference numerals, and a description of those items will be omitted. Although the resolution for expressing pitch periods and the encoding frequency are controlled in units of frames in the description given below, the resolution for expressing pitch periods and the encoding frequency may also be controlled in units of subframes or superframes.

[Configuration]

Figure 5:
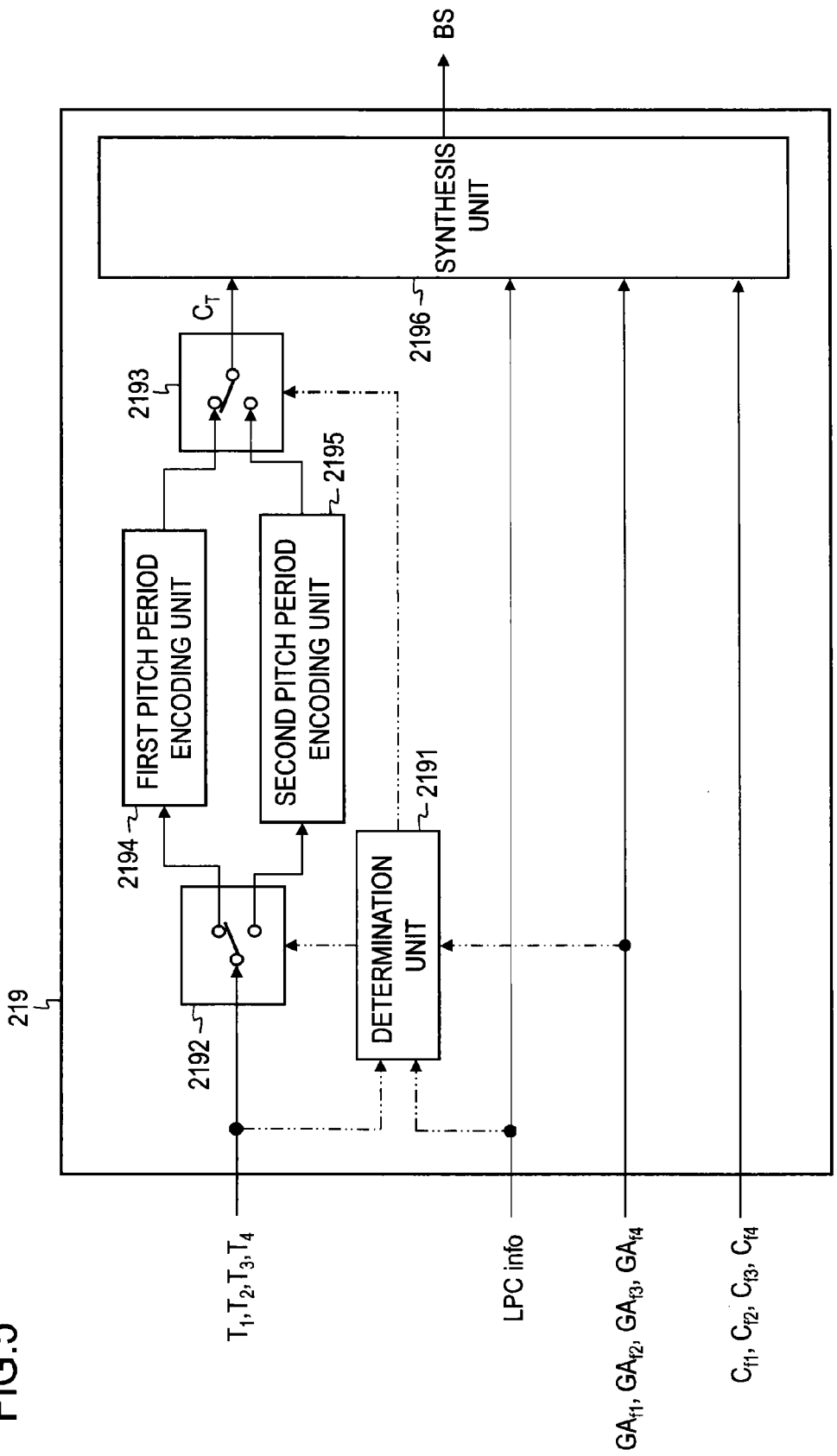
FIG. 5 is a view showing an example of the functional configuration of a parameter encoding unit in a second embodiment.

As shown in FIG. 1, an encoder 21 in the second embodiment includes a linear prediction analysis unit 111, an adaptive codebook 112, a fixed codebook 113, a pitch analysis unit 214, a fixed-codebook search unit 115, a perceptual weighting filter 116, a synthesis filter 117, a gain quantization unit 118, and a parameter encoding unit 219. As shown in FIG. 5, the parameter encoding unit 219 includes a determination unit 2191, switches 2192 and 2193, a first pitch period encoding unit 2194, a second pitch period encoding unit 2195, and a synthesis unit 2196.

Figure 6:
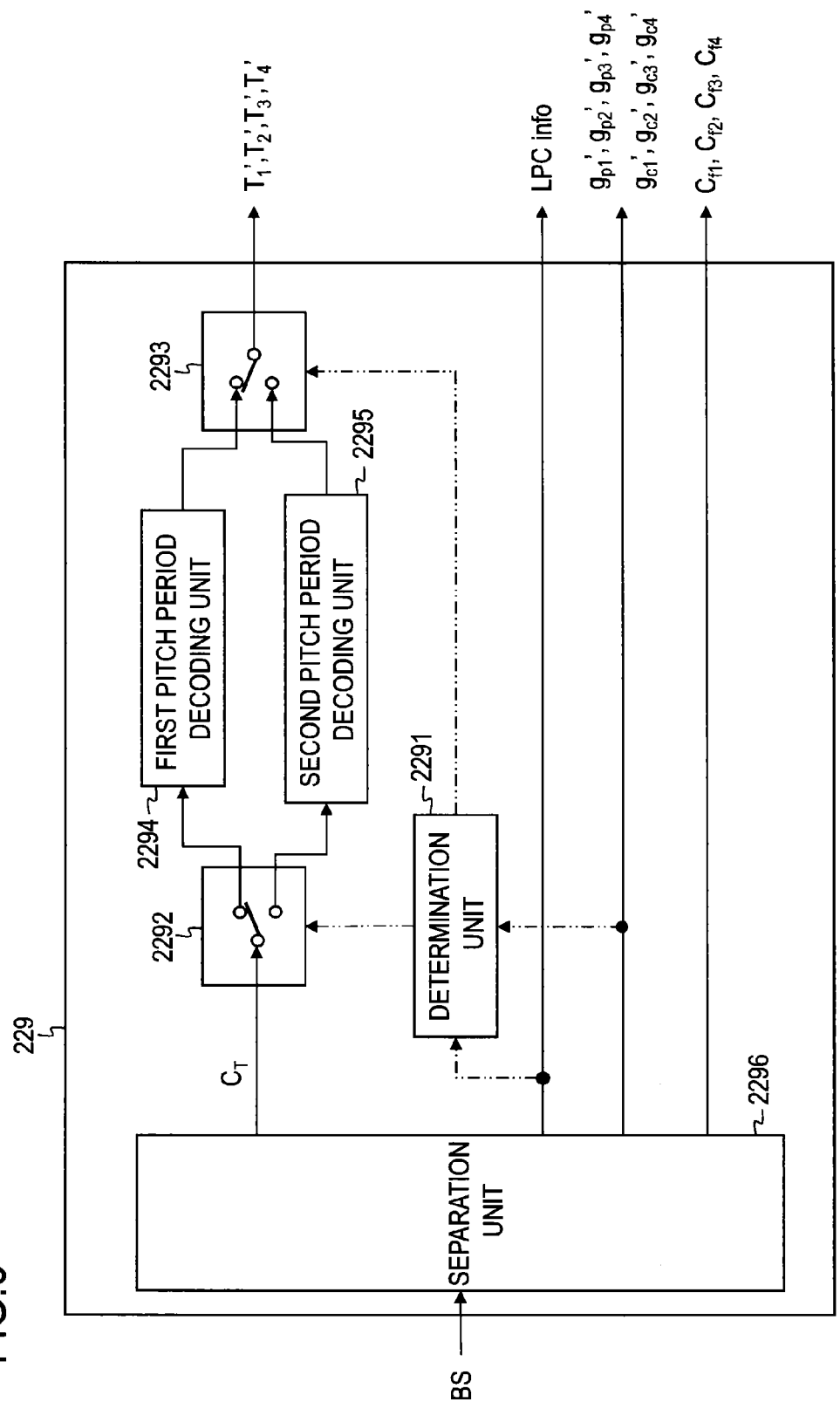
FIG. 6 is a view showing an example of the functional configuration of a parameter decoding unit in the second embodiment.
Figure 7A:
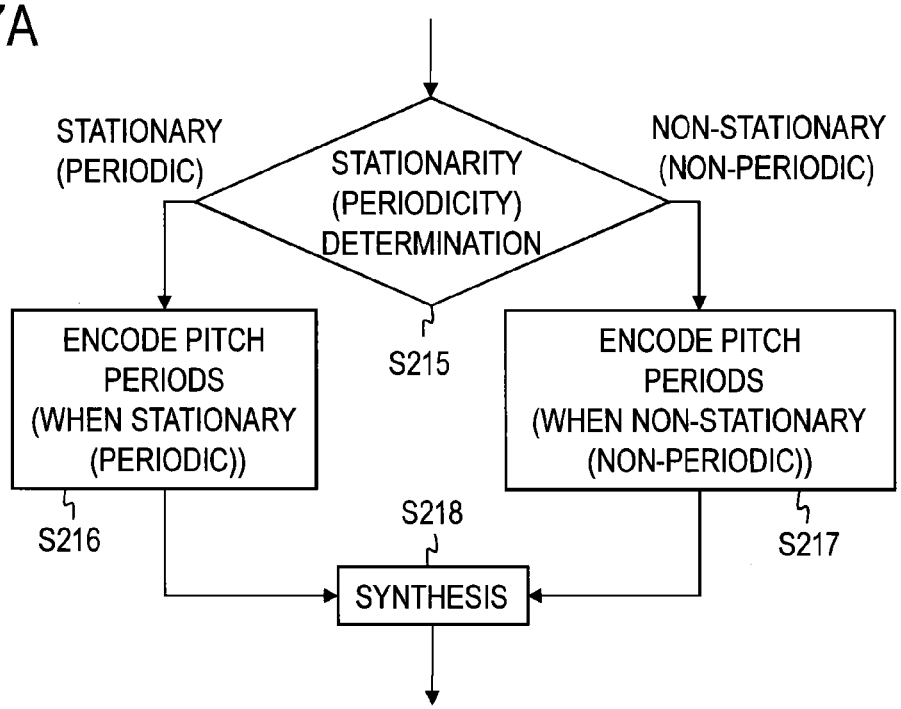
FIG. 7A is a view showing an example of encoding in the second embodiment.
Figure 7B:
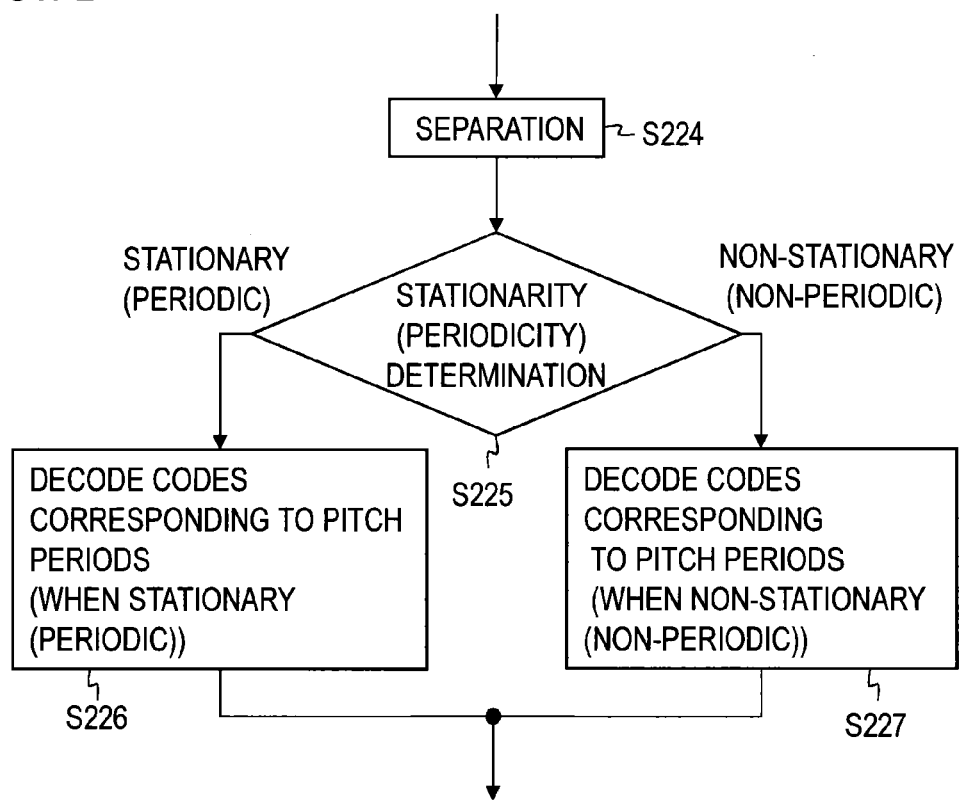
FIG. 7B is a view showing an example of decoding in the second embodiment.

As shown in FIG. 2, a decoder 22 in the second embodiment includes an adaptive codebook 122, a fixed codebook 123, a fixed codebook selection unit 125, a synthesis filter 127, and a parameter decoding unit 229. As shown in FIG. 6, the parameter decoding unit 229 includes a determination unit 2291, switches 2292 and 2293, a first pitch period decoding unit 2294, a second pitch period decoding unit 2295, and a separation unit 2296.

[Encoding Method]

The method differs from the method in the first embodiment just in the processing in the parameter encoding unit 219. Only the processing in the parameter encoding unit 219 will be described below.

Excitation parameters including linear prediction information LPC info, pitch periods $T_1$, $T_2$, $T_3$, and $T_4$, code indices $C_{f1}$, $C_{f2}$, $C_{f3}$, and $C_{f4}$, quantized excitation gain codes $GA_{f1}$, $GA_{f2}$, $GA_{f3}$, and $GA_{f4}$ are input to the parameter encoding unit 219.

The determination unit 2191 (FIG. 5) determines whether the time series signals x(n) (n=0 to L−1) are stationary (periodic) or non-stationary (non-periodic) (step S215). This determination should be made, for example, as described in step S111.

If it is determined in step S215 that the time series signals x(n) (n=0 to L−1) are stationary (periodic), the switch 2192 sends the pitch periods $T_1$, $T_2$, $T_3$, and $T_4$ to the first pitch period encoding unit 2194, under the control of the determination unit 2191. The first pitch period encoding unit 2194 encodes the pitch periods $T_1$, $T_2$, $T_3$, and $T_4$ expressed with a first resolution at first time intervals and outputs pitch period codes $C_T$ obtained (step S216). If it is determined in step S215 that the time series signals x(n) (n=0 to L−1) are non-stationary (non-periodic), the switch 2192 sends the pitch periods $T_1$, $T_2$, $T_3$, and $T_4$ to the second pitch period encoding unit 2195, under the control of the determination unit 2191. The second pitch period encoding unit 2195 encodes the pitch periods $T_1$, $T_2$, $T_3$, and $T_4$ expressed with a second resolution at second time intervals and outputs pitch period codes $C_T$ obtained. Here, the first resolution is higher than the second resolution, and/or the first time interval is shorter than the second time interval (step S217). Specific cases of steps S216 and S217 will be described next.

[Specific Case 1 of Steps S216 and S217]

In this case of step S216 (stationary (periodic)), the resolution for expressing the pitch periods $T_1$, $T_2$, $T_3$, and $T_4$ is fractional resolution (first resolution) or integer resolution, and the first pitch period encoding unit 2194 encodes them in subframes independently. The first pitch period encoding unit 2194 also encodes the differences between the integer parts of the pitch periods $T_2$ and $T_4$ and the integer parts of the pitch periods $T_1$ and $T_3$, the pitch periods being expressed with fractional resolution (first resolution). The first pitch period encoding unit 2194 further encodes the fractional parts of the pitch periods $T_2$ and $T_4$ with two bits each.

In this case of step S217 (non-stationary (non-periodic)), the resolution for expressing the pitch periods $T_1$, $T_2$, $T_3$, and $T_4$ is only integer resolution (second resolution), and the second pitch period encoding unit 2195 encodes the pitch periods in subframes independently and generates codes corresponding to the pitch periods in the current frame. "Encoding in subframes independently" means that the pitch period of a subframe is encoded in an encoding mode independently of the pitch periods in the other subframes.

[Specific Case 2 of Steps S216 and S217]

In this case of step S216 (stationary (periodic)), the first pitch period encoding unit 2194 encodes the pitch periods $T_1$, $T_2$, $T_3$, and $T_4$ in subframes (first time intervals). For example, the values of the pitch periods $T_1$ and $T_3$ are encoded in subframes independently; the differences between the integer parts of the pitch periods $T_2$ and $T_4$ and the integer parts of the pitch periods $T_1$ and $T_3$ are encoded; and the fractional parts of the pitch periods $T_2$ and $T_4$ are encoded with two bits each.

In this case of step S217 (non-stationary (non-periodic)), the second pitch period encoding unit 2195 obtains codes corresponding to pitch periods at time intervals (second time intervals) formed of a plurality of subframes and generates pitch period codes $C_T$ corresponding to the pitch periods $T_1$, $T_2$, $T_3$, and $T_4$ in the current frame. Specifically, codes are generated for a plurality of subframes by using common pitch periods (the pitch period encoding frequency is lowered). For example, either of the codes obtained by encoding the pitch periods $T_1$ and $T_2$ expressed with integer resolution is used as a common code of the pitch periods of the first and second subframes, and either of the codes obtained by encoding the pitch periods $T_3$ and $T_4$ expressed with integer resolution is used as a common code of the pitch periods of the third and fourth subframes. (End of description of [Specific case 2 of steps S216 and S217])

The pitch period codes $C_T$ corresponding to the pitch periods $T_1$, $T_2$, $T_3$, and $T_4$ in the current frame output from the first pitch period encoding unit 2194 or the second pitch period encoding unit 2195 are sent by the switch 2193 to the synthesis unit 2196 under the control of the determination unit 2191. The synthesis unit 2196 generates a bit stream BS by combining the linear prediction information LPC info, the code indices $C_{f1}$, $C_{f2}$, $C_{f3}$, and $C_{f4}$, the pitch period codes $C_T$ corresponding to the pitch periods in the current frame, and the quantized excitation gain codes $GA_{f1}$, $GA_{f2}$, $GA_{f3}$, and $GA_{f4}$, such as VQ gain codes, and outputs it (step S218).

[Decoding Method]

The bit stream BS output from the parameter encoding unit 219 in the encoder 21 (FIG. 1) is input to the parameter decoding unit 229 in the decoder 22 (FIG. 2). The parameter decoding unit 229 decodes the bit stream BS and outputs linear prediction information LPC info, pitch periods $T_1'$, $T_2'$, $T_3'$, and $T_4'$, code indices $C_{f1}$, $C_{f2}$, $C_{f3}$, and $C_{f4}$, and quantized pitch gains $\hat{g}_{p1}$, $\hat{g}_{p2}$, $\hat{g}_{p3}$, and $\hat{g}_{p4}$ and quantized fixed-codebook gains $\hat{g}_{c1}$, $\hat{g}_{c2}$, $\hat{g}_{c3}$, and $\hat{g}_{c4}$ corresponding to quantized excitation gain codes $GA_{f1}$, $GA_{f2}$, $GA_{f3}$, and $GA_{f4}$. The method differs from the method in the first embodiment only in the processing in the parameter decoding unit 229. Only the processing in the parameter decoding unit 229 will be described below.

The separation unit 2296 in the parameter decoding unit 229 (FIG. 6) separates from the bit stream BS or decodes the bit stream BS, and outputs the linear prediction information LPC info, the code indices $C_{f1}$, $C_{f2}$, $C_{f3}$, and $C_{f4}$, the pitch period codes $C_T$ corresponding to the pitch periods in the current frame, the quantized pitch gains $\hat{g}_{p1}$, $\hat{g}_{p2}$, $\hat{g}_{p3}$, and $\hat{g}_{p4}$, and the quantized fixed-codebook gains $\hat{g}_{c1}$, $\hat{g}_{c2}$, $\hat{g}_{c3}$, and $\hat{g}_{c4}$ and outputs them. The quantized pitch gains $\hat{g}_{p1}$, $\hat{g}_{p2}$, $\hat{g}_{p3}$, and $\hat{g}_{p4}$ and the quantized fixed-codebook gains $\hat{g}_{c1}$, $\hat{g}_{c2}$, $\hat{g}_{c3}$, and $\hat{g}_{c4}$ are obtained by decoding the quantized excitation gain codes $GA_{f1}$, $GA_{f2}$, $GA_{f3}$, and $GA_{f4}$ (step S224).

To specify a decoding mode for the pitch period codes $C_T$, the determination unit 2291 determines whether the signals are stationary (periodic) or non-stationary (non-periodic) in the current frame (step S225). This determination is made using the same method as used in step S215 in the encoder 21.

The decoding mode for the pitch period codes $C_T$ is switched in accordance with the result of determination in step S225. If it is determined in step S225 that the signals are stationary (periodic), the switch 2292 sends the pitch period codes $C_T$ of the current frame to the first pitch period decoding unit 2294 under the control of the determination unit 2291. The first pitch period decoding unit 2294 decodes the pitch period codes $C_T$ using a decoding process corresponding to the encoding process which has been performed by the first pitch period encoding unit 2194 (FIG. 5), and obtains and outputs the pitch periods $T'=T_1'$, $T_2'$, $T_3'$, and $T_4'$ of the current frame (step S226). The first pitch period decoding unit 2294 decodes the codes obtained by encoding the pitch periods expressed with the first resolution at the first time intervals. In other words, codes corresponding to pitch periods are decoded in the decoding mode of obtaining pitch periods expressed with the first resolution at first time intervals. Specific examples of step S226 will be described next.

[When Specific Case 1 or 2 of Step S216 is Used in Encoder 21]

In this case, the first pitch period decoding unit 2294 extracts the pitch period $T_1'$ of the first subframe and the pitch period $T_3'$ of the second subframe from the pitch period codes $C_T$ and outputs them. The first pitch period decoding unit 2294 also extracts, from the pitch period codes $C_T$, the difference between the integer part of the pitch period of the second subframe and the integer part of the pitch period of the first subframe, the difference between the integer part of the pitch period of the fourth subframe and the integer part of the pitch period of the third subframe, the fractional part of the pitch period of the second subframe, and the fractional part of the pitch period of the fourth subframe.

The first pitch period decoding unit 2294 further obtains the pitch period $T_2'$ of the second subframe by adding the integer part of the pitch period of the first subframe obtained from the pitch period $T_1'$ of the first subframe, the difference between the integer part of the pitch period of the second subframe and the integer part of the pitch period of the first subframe, and the fractional part of the pitch period of the second subframe, and outputs it.

The first pitch period decoding unit 2294 also obtains the pitch period $T_4'$ of the fourth subframe by adding the integer part of the pitch period of the third subframe obtained from the pitch period $T_3'$ of the third subframe, the difference between the integer part of the pitch period of the fourth subframe and the integer part of the pitch period of the third subframe, and the fractional part of the pitch period of the fourth subframe, and outputs it.

(End of Description of Specific Case of Step S226)

If it is determined in step S225 that the signals are non-stationary (non-periodic), the switch 2292 sends the pitch period codes $C_T$ of the current frame to the second pitch period decoding unit 2295 under the control of the determination unit 2291. The second pitch period decoding unit 2295 decodes the pitch period codes $C_T$ using a decoding process corresponding to the encoding process which has been performed by the second pitch period encoding unit 2195 (FIG. 5) and outputs the pitch periods $T'=T_1'$, $T_2'$, $T_3'$, and $T_4'$ of the current frame (step S227). Specific cases of step S227 will be described next.

[When Specific Case 1 of Step S217 is Used in Encoder 21]

In this case, the second pitch period decoding unit 2295 extracts the pitch periods $T_1'$, $T_2'$, $T_3'$, and $T_4'$ of the first to fourth subframes expressed with integer resolution (second resolution) from the pitch period codes $C_T$ and outputs them.

[When Specific Case 2 of Step S217 is Used in Encoder 21]

In this case, the second pitch period decoding unit 2295 extracts, from the pitch period codes $C_T$, pitch periods in time intervals (second time intervals) composed of a plurality of subframes and outputs them. In other words, codes corresponding to pitch periods are decoded in the decoding mode of obtaining pitch periods at the second time intervals. In an example in which the first and second subframes and the third and fourth subframes form the second time intervals, identical pitch periods $T_1'$ and $T_2'=T_1'$ are extracted for the first and second subframes, identical pitch periods $T_3'$ and $T_4'=T_3'$ are extracted for the third and fourth subframes, and the pitch periods $T_1'$, $T_2'$, $T_3'$, and $T_4'$ are output (end of specific case of step S227).

The pitch periods $T_1'$, $T_2'$, $T_3'$, $T_4'$ of the current frame, obtained by decoding, are output by the switch 2293 under the control of the determination unit 2291. The parameter decoding unit 229 further outputs the linear prediction information LPC info, the code indices $C_{f1}$, $C_{f2}$, $C_{f3}$, and $C_{f4}$, the quantized pitch gains $g_{p1}'$, $g_{p2}'$, $g_{p3}'$, and $g_{p4}'$, and the quantized fixed-codebook gains $g_{c1}'$, $g_{c2}'$, $g_{c3}'$, and $g_{c4}'$. The subsequent processes are the same as in the first embodiment.

[Other Variations]

The present invention will not be confined by the embodiments described above. For example, the number of bits (number of assigned bits) of codes corresponding to some excitation parameters in a frame may be obtained, and the way of obtaining remaining excitation parameters and the encoding method for the frame may be selected in accordance with the number of unassigned (remaining) bits obtained by subtracting the number of assigned bits from the stipulated number of bits determined for the codes in the frame. For example, when the number of unassigned bits is larger than a specified value, the pitch period search range included in the remaining excitation parameters in the frame may be extended, the pitch period search resolution and frequency may be increased, the number of bits assigned to a code corresponding to a pulse sequence included in the remaining excitation parameters may be increased, or the quantization interval (quantization step) of the quantized excitation gain codes included in the remaining excitation parameters may be decreased, in comparison with a case when the number of unassigned bits is not larger than the specified value.

Alternatively, the total number of bits of codes corresponding to a frame may be kept constant. In other words, the total number of predetermined bits may be assigned to codes corresponding to a time interval that includes a predetermined time interval and a second predetermined time interval after the predetermined time interval. In that case, as described in the first or second embodiment, the fixed-codebook search unit 115 selects the number of bits to be assigned to codes corresponding to prediction residuals obtained according to the prediction analysis of the time series signals included in the predetermined time interval. The fixed-codebook search unit 115 further determines the number of bits to be assigned to codes corresponding to second prediction residuals obtained from the prediction analysis of the time series signals included in the second predetermined time interval, according, for example, to the number of unassigned bits determined from the total number of bits and the number of bits assigned to the codes corresponding to the prediction residuals and obtains codes corresponding to the second prediction residuals. For example, as shown in FIG. 8, the pitch analysis, the fixed-codebook search and the encoding, and the gain quantization and the encoding, described earlier in the first or second embodiment, are performed in the first to third subframes, and pitch analysis is performed in the fourth subframe, to obtain the pitch periods $T_1$, $T_2$, $T_3$, and $T_4$, the code indices $C_{f1}$, $C_{f2}$, and $C_{f3}$, and the quantized excitation gains $GA_{f1}$, $GA_{f2}$, and $GA_{f3}$. The sum of the number of bits of the pitch period codes $C_T$ corresponding to the pitch periods $T_1$, $T_2$, $T_3$, and $T_4$, the number of bits of the code indices $C_{f1}$, $C_{f2}$, and $C_{f3}$, and the number of bits of the quantized excitation gains $GA_{f1}$, $GA_{f2}$, and $GA_{f3}$ is specified as the number of assigned bits, and the number of bits unassigned in the frame is obtained. The number of unassigned bits is assigned to the code index $C_{f4}$ and the quantized excitation gain code $GA_{f4}$ in the fourth subframe (assigning the number of unassigned bits), and the code index $C_{f4}$ and the quantized excitation gain code $GA_{f4}$ are obtained with the assigned number of bits. The number of unassigned bits may be assigned to the code index $C_{f4}$ and the quantized excitation gain code $GA_{f4}$ at a predetermined ratio, and a fixed number of bits may be assigned to either the code index $C_{f4}$ or the quantized excitation gain code $GA_{f4}$ in the fourth subframe.

Alternatively, the pitch periods $T_1$, $T_2$, $T_3$, and $T_4$, the code indices $C_{f1}$, $C_{f2}$, $C_{f3}$, and $C_{f4}$, and the quantized excitation gain codes $GA_{f1}$, $GA_{f2}$, and $GA_{f3}$ may be obtained as described earlier in the first or second embodiment; the sum of the number of bits of the pitch period codes $C_T$ corresponding to the pitch periods $T_1$, $T_2$, $T_3$, and $T_4$, the number of bits of the code indices $C_{f1}$, $C_{f2}$, $C_{f3}$, and $C_{f4}$, and the number of bits of the quantized excitation gain codes $GA_{f1}$, $GA_{f2}$, and $GA_{f3}$ is specified as the number of assigned bits; and the number of unassigned bits obtained by subtracting the number of assigned bits from the stipulated number of bits may be assigned to the quantized excitation gain code $GA_{f4}$ of the fourth subframe.

If the encoding mode in a subframe included in the frame is selected in accordance with the number of unassigned bits, the decoding mode corresponding to the encoding mode may be determined in decoding, depending on the number of unassigned bits. Specifically, the fixed codebook selection unit 125 may select a decoding mode for codes corresponding to second noise or a second pulse sequence included in codes corresponding to the second predetermined time interval, in accordance with the number of bits assigned to the second predetermined time interval, determined from the total number of bits and the number of bits of codes corresponding to noise or a pulse sequence included in codes corresponding to the predetermined time interval, may decode the codes corresponding to the second noise or the second pulse sequence, and may obtain second noise or a second pulse sequence corresponding to the second predetermined time interval.

In the embodiments described earlier, the number of bits assigned to a code corresponding to a pulse sequence is selected in accordance with whether the index that indicates the level of periodicity and/or stationarity satisfies the condition that indicates high periodicity and/or high stationarity or the condition that indicates low periodicity and/or low stationarity. The number of bits assigned to noise obtained from prediction analysis of the time series signals included in a predetermined time interval may be selected in accordance with a similar determination criterion, and codes corresponding to noise may be generated. For example, the number of bits assigned to codes corresponding to prediction residuals (noise) obtained by linear prediction analysis of the time series signals in a predetermined time interval may be selected in accordance with the determination result of whether the signals are stationary (periodic) or non-stationary (non-periodic), and codes corresponding to the prediction residuals may be generated.

The number of bits assigned to codes corresponding to noise or a pulse sequence may be selected from three or more different numbers of bits in accordance with whether an index that indicates a level of periodicity and/or stationarity satisfies a condition that indicates high periodicity and/or high stationarity or a condition that indicates low periodicity and/or low stationarity, not from two different numbers of bits determined according to whether the signals are stationary (periodic) or non-stationary (non-periodic). In that case, a plurality of conditions that indicate high periodicity and/or high stationarity and a plurality of conditions that indicate low periodicity and/or low stationarity may be specified. For example, 25 bits may be assigned when the index satisfies a first condition and a second condition, 20 bits may be assigned when the index satisfies the first condition but does not satisfy the second condition, and 18 bits may be assigned when the index satisfies neither the first condition nor the second condition.

Alternatively, the bit stream BS may include side information with which the encoder 11 or encoder 21 can specify an item (the number of bits of codes corresponding to noise or a pulse sequence, the pitch period resolution, the encoding mode, etc.) selected in accordance with whether an index that indicates a level of periodicity and/or stationarity specifies a condition that indicates high periodicity and/or high stationarity or a condition that indicates low periodicity and/or low stationarity. In that case, the decoder 12 or decoder 22 can specify the selected item by using the side information included in the bit stream BS.

Each type of processing described above may be executed not only time sequentially according to the order in the description but also in parallel or individually when necessary or according to the processing capability of each apparatus that executes the processing. Appropriate changes can be made to the embodiments without departing from the scope of the present invention.

When the configurations described above are implemented by a computer, the processing details of the functions that should be provided by each apparatus are described in a program. When the program is executed by the computer, the processing functions are implemented on the computer.

The program containing the processing details can be recorded in a computer-readable recording medium. The computer-readable recording medium can be a non-transitory recording medium. Such recording media include, for example, a magnetic recording device, an optical disc, a magneto-optical recording medium, and a semiconductor memory.

The program is distributed by selling, transferring, or lending a portable recording medium, such as a DVD or a CD-ROM, with the program recorded on it, for example. The program may also be distributed by storing the program in a storage unit of a server computer and transferring the program from the server computer to another computer through a network.

A computer that executes this type of program first stores the program recorded on a portable recording medium or the program transferred from the server computer in its storage unit. Then, the computer reads the program stored in its storage unit and executes processing in accordance with the read program. In a different program execution form, the computer may read the program directly from the portable recording medium and execute processing in accordance with the program, or the computer may execute processing in accordance with the program each time the computer receives the program transferred from the server computer. Alternatively, the above-described processing may be executed by a so-called application service provider (ASP) service, in which the processing functions are implemented just by giving program execution instructions and obtaining the results without transferring the program from the server computer to the computer. The program of this form includes information that is provided for use in processing by the computer and is treated correspondingly as a program (something that is not a direct instruction to the computer but is data or the like that has characteristics that determine the processing executed by the computer).

In the description given above, each apparatus is implemented by executing the predetermined program on the computer, but at least a part of the processing details may be implemented by hardware.

DESCRIPTION OF REFERENCE NUMERALS 11, 21: Encoders
12, 22: Decoders

What is claimed is:

1. A computer-implemented encoding method executing on a processor, the method comprising acquiring codes corresponding to prediction residuals obtained according to prediction analysis applied to time series signals included in a predetermined time interval of input time series signals which are speech or acoustic signals, with the number of bits to be assigned to the codes corresponding to the prediction residuals being switched according to whether an index that indicates a level of periodicity and/or stationarity corresponding to the time series signals in the predetermined time interval or time series signals in an interval before the predetermined time interval of the input time series signals satisfies a condition that indicates high periodicity and/or high stationarity or a condition that indicates low periodicity and/or low stationarity, wherein the number of bits of the codes corresponding to the prediction residuals, obtained when the index that indicates the level of periodicity and/or stationarity satisfies the condition that indicates high periodicity and/or high stationarity, is smaller than the number of bits of the codes corresponding to the prediction residuals, obtained when the index that indicates the level of periodicity and/or stationarity does not satisfy the condition that indicates high periodicity and/or high stationarity; or the number of bits of the codes corresponding to the prediction residuals, obtained when the index that indicates the level of periodicity and/or stationarity satisfies the condition that indicates low periodicity and/or low stationarity, is larger than the number of bits of the codes corresponding to the prediction residuals, obtained when the index that indicates the level of periodicity and/or stationarity does not satisfy the condition that indicates low periodicity and/or low stationarity, wherein a predetermined total number of bits is assigned to codes corresponding to a time interval that includes the predetermined time interval and a second predetermined time interval after the predetermined time interval; and the number of bits to be assigned to codes corresponding to second prediction residuals obtained according to prediction analysis applied to time series signals included in the second predetermined time interval is determined according to the number of unassigned bits determined from the total number of bits and the number of bits to be assigned to the codes corresponding to the prediction residuals obtained according to the prediction analysis applied to the time series signals included in the predetermined time interval, to acquire, with the determined number of bits, the codes corresponding to the second prediction residuals.

2. The encoding method according to claim 1, wherein the index includes a quantized pitch gain or a value corresponding thereto;

the condition that indicates high periodicity and/or high stationarity includes a condition that indicates that the quantized pitch gain or the value corresponding thereto is larger than a predetermined specified value; or the condition that indicates low periodicity and/or low stationarity includes a condition that indicates that the quantized pitch gain or the value corresponding thereto is smaller than the predetermined specified value.

3. The encoding method according to claim 1,
wherein the index includes a vector-quantized gain code corresponding to a combination of a quantized pitch gain or a value corresponding thereto, and a quantized fixed-codebook gain or a value corresponding thereto;
the condition that indicates high periodicity and/or high stationarity includes a condition that indicates that the vector-quantized gain code corresponds to a combination of a quantized pitch gain or a value corresponding thereto that is larger than a predetermined specified value, and a quantized fixed-codebook gain or a value corresponding thereto; or
the condition that indicates low periodicity and/or low stationarity includes a condition that indicates that the vector-quantized gain code corresponds to a combination of a quantized pitch gain or a value corresponding thereto that is smaller than the predetermined specified value, and a quantized fixed-codebook gain or a value corresponding thereto.

4. The encoding method according to claim 1,
wherein the index includes a quantized pitch gain or a value corresponding thereto, and a quantized fixed-codebook gain or a value corresponding thereto;
the condition that indicates high periodicity and/or high stationarity includes a condition that indicates that a ratio of the quantized pitch gain or the value corresponding thereto to the quantized fixed-codebook gain or the value corresponding thereto is larger than a predetermined specified value; or
the condition that indicates low periodicity and/or low stationarity includes a condition that indicates that a ratio of the quantized pitch gain or the value corresponding thereto to the quantized fixed-codebook gain or the value corresponding thereto is smaller than a predetermined specified value.

5. The encoding method according to claim 1,
wherein the index includes a vector-quantized gain code corresponding to a combination of a quantized pitch gain or a value corresponding thereto, and a quantized fixed-codebook gain or a value corresponding thereto;
the condition that indicates high periodicity and/or high stationarity includes a condition that indicates that the vector-quantized gain code corresponds to a combination of a quantized pitch gain or a value corresponding thereto, and a quantized fixed-codebook gain or a value corresponding thereto, a ratio of the quantized pitch gain or the value corresponding thereto to the quantized fixed-codebook gain or the value corresponding thereto being larger than a predetermined specified value; or
the condition that indicates low periodicity and/or low stationarity includes a condition that indicates that the vector-quantized gain code corresponds to a combination of a quantized pitch gain or a value corresponding thereto, and a quantized fixed-codebook gain or a value corresponding thereto, a ratio of the quantized pitch gain or the value corresponding thereto to the quantized fixed-codebook gain or the value corresponding thereto being smaller than the predetermined specified value.

6. The encoding method according to claim 1,
wherein the index includes a quantized pitch gain or a value corresponding thereto, and a value corresponding to a quantized fixed-codebook gain;
the condition that indicates high periodicity and/or high stationarity includes a condition that indicates that the quantized pitch gain or the value corresponding thereto is larger than a first predetermined specified value and that the value corresponding to the quantized fixed-codebook gain is smaller than a second predetermined specified value; or
the condition that indicates low periodicity and/or low stationarity includes a condition that indicates that the quantized pitch gain or the value corresponding thereto is smaller than a first predetermined specified value and that the value corresponding to the quantized fixed-codebook gain is larger than a second predetermined specified value.

7. The encoding method according to claim 1,
wherein the index includes a vector-quantized gain code corresponding to a combination of a quantized pitch gain or a value corresponding thereto, and a value corresponding to a quantized fixed-codebook gain;
the condition that indicates high periodicity and/or high stationarity includes a condition that indicates that the quantized pitch gain or the value corresponding thereto corresponding to the vector-quantized gain code is larger than a first predetermined specified value and that the value corresponding to the quantized fixed-codebook gain corresponding to the vector-quantized gain code is smaller than a second predetermined specified value; or
the condition that indicates low periodicity and/or low stationarity includes a condition that indicates that the quantized pitch gain or the value corresponding thereto corresponding to the vector-quantized gain code is smaller than a first predetermined specified value and that the value corresponding to the quantized fixed-codebook gain corresponding to the vector-quantized gain code is larger than a second predetermined specified value.

8. The encoding method according to claim 1,
wherein the index includes a quantized PARCOR coefficient or a value corresponding thereto;
the condition that indicates high periodicity and/or high stationarity includes a condition that indicates that the quantized PARCOR coefficient or the value corresponding thereto is larger than a predetermined specified value; or
the condition that indicates low periodicity and/or low stationarity includes a condition that indicates that the quantized PARCOR coefficient or the value corresponding thereto is smaller than a predetermined specified value.

9. The encoding method according to claim 1,
wherein the index includes an estimated value of a prediction gain determined by a quantized PARCOR coefficient or a value corresponding thereto;
the condition that indicates high periodicity and/or high stationarity includes a condition that indicates that the estimated value of the prediction gain is larger than a predetermined specified value; or
the condition that indicates low periodicity and/or low stationarity includes a condition that indicates that the estimated value of the prediction gain is smaller than a predetermined specified value.

10. The encoding method according to claim 1,
wherein the index includes the magnitude of the difference between a value corresponding to a pitch period of the time series signals in a first time interval and a value corresponding to a pitch period of the time series signals in a second time interval having a predetermined positional relationship with the first time interval, or a value corresponding to the magnitude of the difference;

the condition that indicates high periodicity and/or high stationarity includes a condition that indicates that the magnitude of the difference or the value corresponding thereto is smaller than a predetermined specified value; or the condition that indicates low periodicity and/or low stationarity includes a condition that indicates that the magnitude of the difference or the value corresponding thereto is larger than a predetermined specified value.

11. A computer-implemented decoding method executing on a processor, the method comprising decoding codes corresponding to noise or a pulse sequence included in inputted codes corresponding to a speech or acoustic signal sampled in a predetermined time interval to acquire noise or a pulse sequence corresponding to the predetermined time interval, with a decoding mode for the codes corresponding to the noise or the pulse sequence being switched according to whether an index that indicates a level of periodicity and/or stationarity corresponding to the predetermined time interval or an interval before the predetermined interval, the index being included in input codes or obtained from the codes, satisfies a condition that indicates high periodicity and/or high stationarity or a condition that indicates low periodicity and/or low stationarity,
wherein codes having a first number of bits, corresponding to the noise or the pulse sequence are decoded when the index that indicates the level of periodicity and/or stationarity satisfies the condition that indicates high periodicity and/or high stationarity, and codes having a second number of bits, corresponding to the noise or the pulse sequence are decoded when the index that indicates the level of periodicity and/or stationarity does not satisfy the condition that indicates high periodicity and/or high stationarity; or
codes having the second number of bits, corresponding to the noise or the pulse sequence are decoded when the index that indicates the level of periodicity and/or stationarity satisfies the condition that indicates low periodicity and/or low stationarity, and codes having the first number of bits, corresponding to the noise or the pulse sequence are decoded when the index that indicates the level of periodicity and/or stationarity does not satisfy the condition that indicates low periodicity and/or low stationarity; and
the first number of bits is smaller than the second number of bits,
wherein a predetermined total number of bits is assigned to codes corresponding to a time interval that includes the predetermined time interval and a second predetermined time interval after the predetermined time interval; and
a decoding mode for codes corresponding to second noise or a second pulse sequence included in codes corresponding to the second predetermined time interval is switched according to the number of bits assigned to the second predetermined time interval, determined from the total number of bits and the number of bits of the codes corresponding to the noise or the pulse sequence included in the codes corresponding to the predetermined time interval, to decode the codes corresponding to the second noise or the second pulse sequence to acquire second noise or a second pulse sequence corresponding to the second predetermined time interval.

12. The decoding method according to claim 11,
wherein the index includes a quantized pitch gain or a value corresponding thereto, the quantized pitch gain being obtained from the input codes;

the condition that indicates high periodicity and/or high stationarity includes a condition that indicates that the quantized pitch gain or the value corresponding thereto is larger than a predetermined specified value; or the condition that indicates low periodicity and/or low stationarity includes a condition that indicates that the quantized pitch gain or the value corresponding thereto is smaller than a predetermined specified value.

13. The decoding method according to claim 11,
wherein the index includes a vector-quantized gain code corresponding to a combination of a quantized pitch gain or a value corresponding thereto, and a quantized fixed-codebook gain or a value corresponding thereto, the vector-quantized gain code being included in the input codes;

the condition that indicates high periodicity and/or high stationarity includes a condition that indicates that the vector-quantized gain code corresponds to a combination of a quantized pitch gain or a value corresponding thereto that is larger than a predetermined specified value, and a quantized fixed-codebook gain or a value corresponding thereto; or the condition that indicates low periodicity and/or low stationarity includes a condition that indicates that the vector-quantized gain code corresponds to a combination of a quantized pitch gain or a value corresponding thereto that is smaller than a predetermined specified value, and a quantized fixed-codebook gain or a value corresponding thereto.

14. The decoding method according to claim 11,
wherein the index includes a quantized pitch gain or a value corresponding thereto, and a quantized fixed-codebook gain or a value corresponding thereto, the quantized pitch gain being obtained from the input codes and the quantized fixed-codebook gain being obtained from the input codes;

the condition that indicates high periodicity and/or high stationarity includes a condition that indicates that a ratio of the quantized pitch gain or the value corresponding thereto to the quantized fixed-codebook gain or the value corresponding thereto is larger than a predetermined specified value; or the condition that indicates low periodicity and/or low stationarity includes a condition that indicates that a ratio of the quantized pitch gain or the value corresponding thereto to the quantized fixed-codebook gain or the value corresponding thereto is smaller than a predetermined specified value.

15. The decoding method according to claim 11,
wherein the index includes a vector-quantized gain code corresponding to a combination of a quantized pitch gain or a value corresponding thereto, and a quantized fixed-codebook gain or a value corresponding thereto, the vector-quantized gain code being included in the input codes;

the condition that indicates high periodicity and/or high stationarity includes a condition that indicates that the vector-quantized gain code corresponds to a combination of a quantized pitch gain or a value corresponding thereto, and a quantized fixed-codebook gain or a value corresponding thereto, a ratio of the quantized pitch gain or the value corresponding thereto to the quantized fixed-codebook gain or the value corresponding thereto being larger than a predetermined specified value; or the condition that indicates low periodicity and/or low stationarity includes a condition that indicates that the vector-quantized gain code corresponds to a combination of a quantized pitch gain or a value corresponding thereto, and a quantized fixed-codebook gain or a value corresponding thereto, a ratio of the quantized pitch gain or the value corresponding thereto to the quantized fixed-codebook gain or the value corresponding thereto being smaller than a predetermined specified value.

16. The decoding method according to claim 11,
wherein the index includes a quantized pitch gain or a value corresponding thereto, and a value corresponding to a quantized fixed-codebook gain, the quantized pitch gain being obtained from the input codes and the quantized fixed-codebook gain being obtained from the input codes;
the condition that indicates high periodicity and/or high stationarity includes a condition that indicates that the quantized pitch gain or the value corresponding thereto is larger than a first predetermined specified value and that the value corresponding to the quantized fixed-codebook gain is smaller than a second predetermined specified value; or
the condition that indicates low periodicity and/or low stationarity includes a condition that indicates that the quantized pitch gain or the value corresponding thereto is smaller than a first predetermined specified value and that the value corresponding to the quantized fixed-codebook gain is larger than a second predetermined specified value.

17. The decoding method according to claim 11,
wherein the index includes a vector-quantized gain code corresponding to a combination of a quantized pitch gain or a value corresponding thereto, and a value corresponding to a quantized fixed-codebook gain, the vector-quantized gain code being included in the input codes;
the condition that indicates high periodicity and/or high stationarity includes a condition that indicates that the quantized pitch gain or the value corresponding thereto corresponding to the vector-quantized gain code is larger than a first predetermined specified value and that the value corresponding to the quantized fixed-codebook gain corresponding to the vector-quantized gain code is smaller than a second predetermined specified value; or
the condition that indicates low periodicity and/or low stationarity includes a condition that indicates that the quantized pitch gain or the value corresponding thereto corresponding to the vector-quantized gain code is smaller than a first predetermined specified value and that the value corresponding to the quantized fixed-codebook gain corresponding to the vector-quantized gain code is larger than a second predetermined specified value.

18. The decoding method according to claim 11,
wherein the index includes a quantized PARCOR coefficient or a value corresponding thereto, the quantized PARCOR coefficient being obtained from the input codes;
the condition that indicates high periodicity and/or high stationarity includes a condition that indicates that the quantized PARCOR coefficient or the value corresponding thereto is larger than a predetermined specified value; and
the condition that indicates low periodicity and/or low stationarity includes a condition that indicates that the quantized PARCOR coefficient or the value corresponding thereto is smaller than the predetermined specified value.

19. The decoding method according to claim 11,
wherein the index includes an estimated value of a prediction gain determined by a quantized PARCOR coefficient or a value corresponding thereto, the quantized PARCOR coefficient being obtained from the input codes;
the condition that indicates high periodicity and/or high stationarity includes a condition that indicates that the estimated value of the prediction gain is larger than a predetermined specified value; and
the condition that indicates low periodicity and/or low stationarity includes a condition that indicates that the estimated value of the prediction gain is smaller than the predetermined specified value.

20. The decoding method according to claim 11,
wherein the index includes the magnitude of the difference between a value corresponding to a pitch period in a first time interval, the pitch period being obtained from the input codes, and a value corresponding to a pitch period in a second time interval having a predetermined positional relationship with the first time interval, the pitch period being obtained from the input codes, or a value corresponding to the magnitude of the difference;
the condition that indicates high periodicity and/or high stationarity includes a condition that indicates that the magnitude of the difference or the value corresponding thereto is smaller than a first predetermined specified value; or
the condition that indicates low periodicity and/or low stationarity includes a condition that indicates that the magnitude of the difference or the value corresponding thereto is larger than a second predetermined specified value.

21. A computer-implemented encoder for acquiring codes corresponding to prediction residuals obtained according to prediction analysis applied to time series signals included in a predetermined time interval of input time series signals which are speech or acoustic signals, with the number of bits to be assigned to the codes corresponding to the prediction residuals being switched according to whether an index that indicates a level of periodicity and/or stationarity corresponding to the time series signals in the predetermined time interval or time series signals in an interval before the predetermined time interval of the input time series signals satisfies a condition that indicates high periodicity and/or high stationarity or a condition that indicates low periodicity and/or low stationarity,
wherein the number of bits of the codes corresponding to the prediction residuals, obtained when the index that indicates the level of periodicity and/or stationarity satisfies the condition that indicates high periodicity and/or high stationarity, is smaller than the number of bits of the codes corresponding to the prediction residuals, obtained when the index that indicates the level of periodicity and/or stationarity does not satisfy the condition that indicates high periodicity and/or high stationarity; or
the number of bits of the codes corresponding to the prediction residuals, obtained when the index that indicates the level of periodicity and/or stationarity satisfies the condition that indicates low periodicity and/or low stationarity, is larger than the number of bits of the codes corresponding to the prediction residuals, obtained when the index that indicates the level of periodicity and/or stationarity does not satisfy the condition that indicates low periodicity and/or low stationarity, wherein a predetermined total number of bits is assigned to codes corresponding to a time interval that includes the predetermined time interval and a second predetermined time interval after the predetermined time interval; and the number of bits to be assigned to codes corresponding to second prediction residuals obtained according to prediction analysis applied to time series signals included in the second predetermined time interval is determined according to the number of unassigned bits determined from the total number of bits and the number of bits to be assigned to the codes corresponding to the prediction residuals obtained according to the prediction analysis applied to the time series signals included in the predetermined time interval, to acquire the codes, with the determined number of bits, corresponding to the second prediction residuals.

22. A computer-implemented decoder for decoding codes corresponding to noise or a pulse sequence included in inputted codes corresponding to a speech or acoustic signal sampled in a predetermined time interval to acquire noise or a pulse sequence corresponding to the predetermined time interval, with a decoding mode for the codes corresponding to the noise or the pulse sequence being switched according to whether an index that indicates a level of periodicity and/or stationarity corresponding to the predetermined time interval or an interval before the predetermined interval, the index being included in input codes or obtained from the codes, satisfies a condition that indicates high periodicity and/or high stationarity or a condition that indicates low periodicity and/or low stationarity, wherein codes having a first number of bits, corresponding to the noise or the pulse sequence are decoded when the index that indicates the level of periodicity and/or stationarity satisfies the condition that indicates high periodicity and/or high stationarity, and codes having a second number of bits, corresponding to the noise or the pulse sequence are decoded when the index that indicates the level of periodicity and/or stationarity does not satisfy the condition that indicates high periodicity and/or high stationarity; or codes having the second number of bits, corresponding to the noise or the pulse sequence are decoded when the index that indicates the level of periodicity and/or stationarity satisfies the condition that indicates low periodicity and/or low stationarity, and codes having the first number of bits, corresponding to the noise or the pulse sequence are decoded when the index that indicates the level of periodicity and/or stationarity does not satisfy the condition that indicates low periodicity and/or low stationarity; and the first number of bits is smaller than the second number of bits, wherein a predetermined total number of bits is assigned to codes corresponding to a time interval that includes the predetermined time interval and a second predetermined time interval after the predetermined time interval; and a decoding mode for codes corresponding to second noise or a second pulse sequence included in codes corresponding to the second predetermined time interval is switched according to the number of bits assigned to the second predetermined time interval, determined from the total number of bits and the number of bits of the codes corresponding to the noise or the pulse sequence included in the codes corresponding to the predetermined time interval, to decode the codes corresponding to the second noise or the second pulse sequence to acquire second noise or a second pulse sequence corresponding to the second predetermined time interval.

23. A non-transitory computer-readable recording medium having stored thereon a program for causing a computer to execute the process of the encoding method according to claim 1.

24. A non-transitory computer-readable recording medium having stored thereon a program for causing a computer to execute the process of the decoding method according to claim 11.

* * * * *